(12) United States Patent
Essig et al.

(10) Patent No.: US 11,437,247 B2
(45) Date of Patent: Sep. 6, 2022

(54) SEMICONDUCTOR PACKAGE STRUCTURE AND METHOD FOR MANUFACTURING THE SAME

(71) Applicant: Advanced Semiconductor Engineering, Inc., Kaohsiung (TW)

(72) Inventors: Kay Stefan Essig, Kaohsiung (TW); Jean Marc Yannou, Kaohsiung (TW); Bradford Factor, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 123 days.

(21) Appl. No.: 16/933,813

(22) Filed: Jul. 20, 2020

(65) Prior Publication Data
US 2022/0020605 A1    Jan. 20, 2022

(51) Int. Cl.
| | |
|---|---|
| *H01L 23/492* | (2006.01) |
| *H01L 21/56* | (2006.01) |
| *H01L 23/00* | (2006.01) |
| *H01L 23/31* | (2006.01) |
| *H01L 25/065* | (2006.01) |
| *H01L 23/498* | (2006.01) |

(52) U.S. Cl.
CPC ........ *H01L 21/565* (2013.01); *H01L 23/3121* (2013.01); *H01L 23/3135* (2013.01); *H01L 23/492* (2013.01); *H01L 23/49811* (2013.01); *H01L 24/16* (2013.01); *H01L 25/0655* (2013.01); *H01L 2224/16227* (2013.01)

(58) Field of Classification Search
CPC ............... H01L 21/565; H01L 23/3121; H01L 23/3135; H01L 23/492; H01L 23/49811; H01L 24/16; H01L 25/0655; H01L 2224/16227
See application file for complete search history.

(56) References Cited

U.S. PATENT DOCUMENTS

| | | | |
|---|---|---|---|
| 7,727,813 B2 | 6/2010 | Otremba et al. | |
| 9,564,387 B2 | 2/2017 | Sirinorakul et al. | |
| 2016/0174381 A1* | 6/2016 | Lee | H05K 1/185 361/761 |

* cited by examiner

*Primary Examiner* — Elias Ullah
(74) *Attorney, Agent, or Firm* — Foley & Lardner LLP

(57) ABSTRACT

A semiconductor package structure and a method of manufacturing a semiconductor package structure are provided. The semiconductor package structure includes a conductive base, a first semiconductor die, a first conductive pillar, and a first encapsulant. The conductive base has a first surface. The first semiconductor die is disposed on the first surface of the conductive base. The first conductive pillar is disposed on the first semiconductor die. The first encapsulant is disposed on the first surface of the conductive base. The first encapsulant encapsulates the first semiconductor die. The first encapsulant includes an opening defined by the first conductive pillar.

18 Claims, 44 Drawing Sheets

SEMICONDUCTOR PACKAGE STRUCTURE AND METHOD FOR MANUFACTURING THE SAME

BACKGROUND

1. Field of the Disclosure

The present disclosure relates to a semiconductor package structure and a method for manufacturing the same, and to a semiconductor package structure including a conductive base, and a method for manufacturing the same.

2. Description of the Related Art

The technique of the embedded package has been widely used for power application because of the better electrical and thermal performance. However, the manufacturing process of the embedded package is complicated since it generally includes the operations of prepreg lamination, the laser drill for defining through vias, the redistribution layer (RDL) formation etc. Inevitably, the complicated manufacturing process of the embedded package would cause low product yield and high cost.

SUMMARY

In some embodiments, a semiconductor package structure includes a conductive base, a first semiconductor die, a first conductive pillar, and a first encapsulant. The conductive base has a first surface. The first semiconductor die is disposed on the first surface of the conductive base. The first conductive pillar is disposed on the first semiconductor die. The first encapsulant is disposed on the first surface of the conductive base. The first encapsulant encapsulates the first semiconductor die. The first encapsulant includes an opening defined by the first conductive pillar.

In some embodiments, a semiconductor package structure includes a conductive base, a first semiconductor die, a first conductive pillar, and a first encapsulant. The first semiconductor die is disposed on the conductive base. The first conductive pillar is disposed on the first semiconductor die. The first encapsulant is disposed on the conductive base. The first conductive pillar and the first encapsulant each have a top surface away from the conductive base. The top surface of the first conductive pillar is higher than or at the same elevation with the top surface of the first encapsulant.

In some embodiments, a method of manufacturing a semiconductor package structure, including: providing a conductive base having a conductive post, wherein the conductive post has a first surface; attaching a first semiconductor die to the first surface of the conductive base, wherein the first semiconductor die comprises a first conductive pillar; and forming a first encapsulant on the first surface of the conductive base to encapsulate the first semiconductor die.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
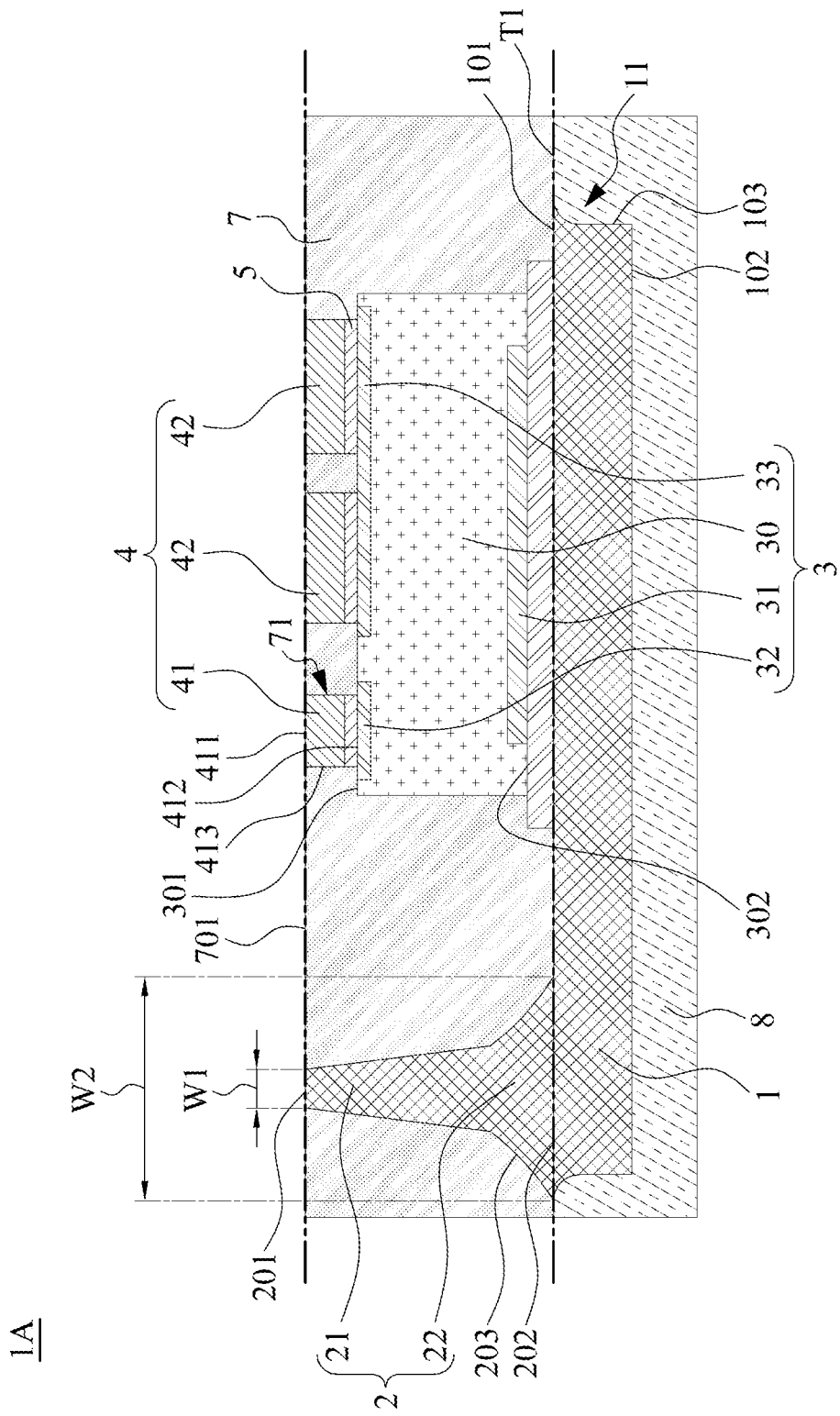
FIG. 1 illustrates a cross-sectional view of a semiconductor package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The present disclosure provides a semiconductor package structure including a conductive base, one or more semiconductor dies, one or more conductive pillars disposed on each of the semiconductor dies, and an encapsulant disposed on the conductive base. The conductive pillars are surrounded by and in contact with the encapsulant. The conductive pillars are implemented prior to the encapsulant being formed, resulting that one or more openings of the encapsulant are defined by the conductive pillars. The present disclosure realizes the electrical connection between the one or more semiconductor dies and an external substrate through the conductive pillars, rather than a costly through-via structure or a redistribution layer (RDL) structure in the conventional technology, such that the product yield can be improved and the process costs can be reduced. Furthermore, the semiconductor package structure may include a conductive post electrically connected to the semiconductor dies through the conductive base, such that the conductive post can electrically connect the semiconductor dies to the external substrate. Moreover, the encapsulant of the present disclosure is formed in a molding process which is faster and cheaper than a prepreg lamination in the conventional the through-via structure or the RDL structure. Furthermore, the electrical connection between semiconductor dies is established in the external substrate rather than through the RDL structure, so no known good die is risked in the package assembly steps.

FIG. 1 illustrates a cross-sectional view of a semiconductor package structure 1A according to some embodiments of the present disclosure. The semiconductor package structure 1A includes a conductive base 1, a conductive post 2, a first semiconductor die 3, a plurality of first conductive pillar 4, a seed layer 5, an adhesive layer 6, a first encapsulant 7, and a second encapsulant 8.

Referring to FIG. 1, the conductive base 1 has a first surface 101 and a second surface 102 opposite to the first surface 102. The conductive post 2 is in contact with the first surface 101 of the conductive base 1. The conductive post 2 has a top surface 201, a bottom surface 202, and a lateral surface 203 extending from the top surface 201 and the bottom surface 202. The conductive post 2 has a tapered profile with a gradually increasing width along the lateral surface 203 from the top surface 201 to the bottom surface 202. Furthermore, the lateral surface 203 of the conductive post 2 may have a curved surface or an inwardly dished surface. In some embodiment, the curvature of the lateral surface 203 may be constant or varied. The curvature of the lateral surface 203 may increase toward an end of the bottom surface 202. As shown in FIG. 1, the conductive post 2 includes a top portion 21 away from the conductive base 1 and a bottom portion 22 close to the conductive base 1. A width W2 of the bottom portion 22 is greater than a width W1 of the top portion 21. The conductive base 1 may include metal or metal alloy such as copper (Cu), gold (Au), aluminum (Al), or the alloy thereof. The conductive post 2 may include metal or metal alloy such as copper (Cu), gold (Au), aluminum (Al), or the alloy thereof.

In some embodiment, the conductive post 2 and the conductive base 1 may be integrally formed. In particular, the conductive post 2 may be formed by half-etching the conductive base 1 into a predetermined thickness. In this case, the bottom surface 202 of the conductive post 2 may not appear as an interface, but an imaginary division between the conductive post 2 and the first surface 101 of the conductive base 1.

Still referring to FIG. 1, the first semiconductor die 3 is disposed on the first surface 101 of the conductive base 1 and has a first surface 301 away from the first surface 101 of the conductive base 1 and a second surface 302 toward the first surface 101 of the conductive base 1. The first semiconductor die 3 is encapsulated by the first encapsulant 7. The first plurality of conductive pillars 4 is disposed on the first semiconductor die 3. The first plurality of conductive pillars 4 includes a first conductive pillar 41 and a second conductive pillar 42. The first conductive pillar 41 has a first surface 411 (e.g., a top surface), a second surface 412 (e.g., a bottom surface), and a lateral surface 413 extending from the first surface 411 and the second surface 412. The first plurality of conductive pillars 4 (or the first conductive pillar 41 and the second conductive pillar 42) is surrounded by and in contact with the first encapsulant 7. The first encapsulant 7 has a first surface 701 (e.g., a top surface) away from the conductive base 1. The first surface 701 of the first encapsulant 7 and the first surface 411 of the first conductive pillar 41 are substantially coplanar. The first surface 411 is at the same elevation with the first surface 701. Furthermore, the first surface 701 of the first encapsulant 7 and the top surface 201 of the conductive post 2 are substantially coplanar. The first surface 701 is at the same elevation with the top surface 201. In some embodiments, the top surfaces 201, 41, and 701 may be substantially coplanar.

The first plurality of conductive pillars 4 may each include metal such as copper (Cu), gold (Au), aluminum (Al), or the like. The first encapsulant 7 may be composed of epoxy and a plurality of fillers. The first encapsulant 7 may include epoxy resin or other suitable mold material. Unlike the conventional counterpart, electrical connection coming out from the embedded die is surrounded by pre-impregnated (pre-preg) lamination which is composed of epoxy and glass fiber.

Still referring to FIG. 1, the seed layer 5 is disposed between each of the first plurality of conductive pillars 4 and the first semiconductor die 3. For example, the seed layer is disposed between the bottom surface 412 of the first conductive pillar 41 and the first surface 301 of the semiconductor die 3. The second conductive pillar 42 is similar to the first conductive pillar 41 in terms of the characteristics and the relationship with the first encapsulant 7. Furthermore, in some embodiments, the lateral surface 413 of the first conductive pillar 41 is not covered by a buffer layer or a seed layer, and is directly in contact with the first encapsulant 7.

In the present disclosure, the first of plurality conductive pillars 4 is implemented before the first encapsulant 7 is formed, resulting that the first encapsulant 7 includes one or more openings defined by the first plurality of conductive pillars 4. For example, the first encapsulant 7 includes an opening 71 defined by the first pillar 41. The roughness of a side surface of the opening 71 is defined by the lateral surface 413 of the first conductive pillar 41. As shown in FIG. 1, the first conductive pillar 41 is free from possessing a lateral extension portion between the top surface 411 and the bottom surface 412. The first conductive pillar 41 may have a uniform width.

Again referring to FIG. 1, the first semiconductor die 3 includes an active region 30, a first electrode 31 disposed adjacent to the second surface 302, and a second electrode 32 and a third electrode 33 each disposed adjacent to the first surface 301. The active region 30 is electrically connected to the first electrode 31, the second electrode 32 or the third electrode 33. In some embodiment, the active region 30 may include a transistor. The first electrode 31, the second electrode 32, the third electrode 33 may be electrically connected to a drain terminal, a gate terminal, a source terminal of the transistor, respectively. The first conductive pillar 41 and the second conductive pillar 42 are electrically connected to the second electrode 32 and the third electrode 33 of the semiconductor die 3, respectively. The first semiconductor die 3 is configured to electrically connect to an external substrate, such as printed circuit board (PCB), through the first plurality of conductive pillars 4. The first conductive pillar 41 or the second conductive pillar 42 may directly transmit the electrical signal from the first semiconductor die 3 to the external substrate without passing through other circuitry in the semiconductor package structure 1A. The semiconductor die 3 of the semiconductor package structure 1A is configured to conduct electrical current in a vertical direction therefore a portion of the electrodes is formed on the first surface 301 of the semiconductor die 3 and at least an electrode is formed on the second surface 302 of the semiconductor die 3. One of the purposes of the conductive post 2 is allowing the access to the first electrode 31 from the side adjacent to the first surface 301.

In some comparative embodiments, a through-via structure or a RDL structure is disposed between a semiconductor chip and a substrate for an electrical connection therebetween. However, the through via structure generally formed by the laser drilling process causes high process costs. On the other hand, the formation of the RDL structure includes a costly pre-preg lamination process. In the present disclosure, the first plurality of conductive pillars 4 which is formed before being encapsulated by the first encapsulant 7 provides a robust electrical transmission path for the first semiconductor die 3 and an external substrate. The cost is relatively low as compared to the through-via structure or the RDL structure. Moreover, the first encapsulant 7 is formed in a molding process which is faster and cheaper than the prepreg lamination used in the RDL structure process.

In some embodiments, the transistor may be a power transistor. The transistor may be capable of carrying the power with 3 kW or less. The transistor may be capable of carrying the power with 3 kW or more. In some embodiment, the active region 30 may include multiple transistors.

Still referring to FIG. 1, the adhesive layer 6 is disposed between the conductive base 1 and the first semiconductor die 3. The adhesive layer 6 may be in contact with the first surface 101 of the conductive base 1 or the first electrode 31 of the first semiconductor die 3. The adhesive layer 6 may be beneficial of the thermal dissipation from the first semiconductor die 3 to the conductive base 1 and the conductive post 2. Furthermore, the adhesive layer 6 may include an electrically conductive material such as silver (Ag), nickel (Ni), copper (Cu), graphite or other suitable alternative. The first electrode 31 may be electrically connected to the conductive base 1 through the adhesive layer 6 with its electrically conductive nature. Furthermore, the conductive post 2 may be electrically connected to the conductive base 1. Subsequently, the first electrode 31 may be electrically connected to the conductive post 2 through the conductive base 1. In some embodiments, the first semiconductor die 3 is configured to electrically connect to an external substrate, such as printed circuit board (PCB) through the conductive post 2.

In some comparative embodiments, a semiconductor chip is disposed on a lead frame and includes an electrode electrically connected to the lead frame. A through-via structure or a RDL structure is implemented to provide an electrical connection from the lead frame to a substrate. However, the through via structure generally formed through the laser drilling process causes high process costs. On the other hand, the formation of the RDL structure includes a costly pre-preg lamination process. In the present disclosure, the conductive post 2 provides a robust electrical transmission path for the semiconductor die 3 and an external substrate.

As shown in FIG. 1, the second encapsulant 8 is disposed on the second surface 102 of the conductive base 1. The conductive base 1 further has a curved surface 103 extending from the first surface 101 to the second surface 102. A portion of the second encapsulant 8 is in contact with the curved surface 103. The curved surface 103 defines a region 11, in which a portion of the second encapsulant 8 disposed. The semiconductor package structure further includes an interface T1 between the first encapsulant 7 and the second encapsulant 8. In some embodiments, the interface T1 is substantially at the same elevation with the first surface 101 of the conductive base 1. In some embodiments, the second encapsulant 8 may entirely cover the second surface 102 to prevent from exposing the conductive base 1.

Figure 2:
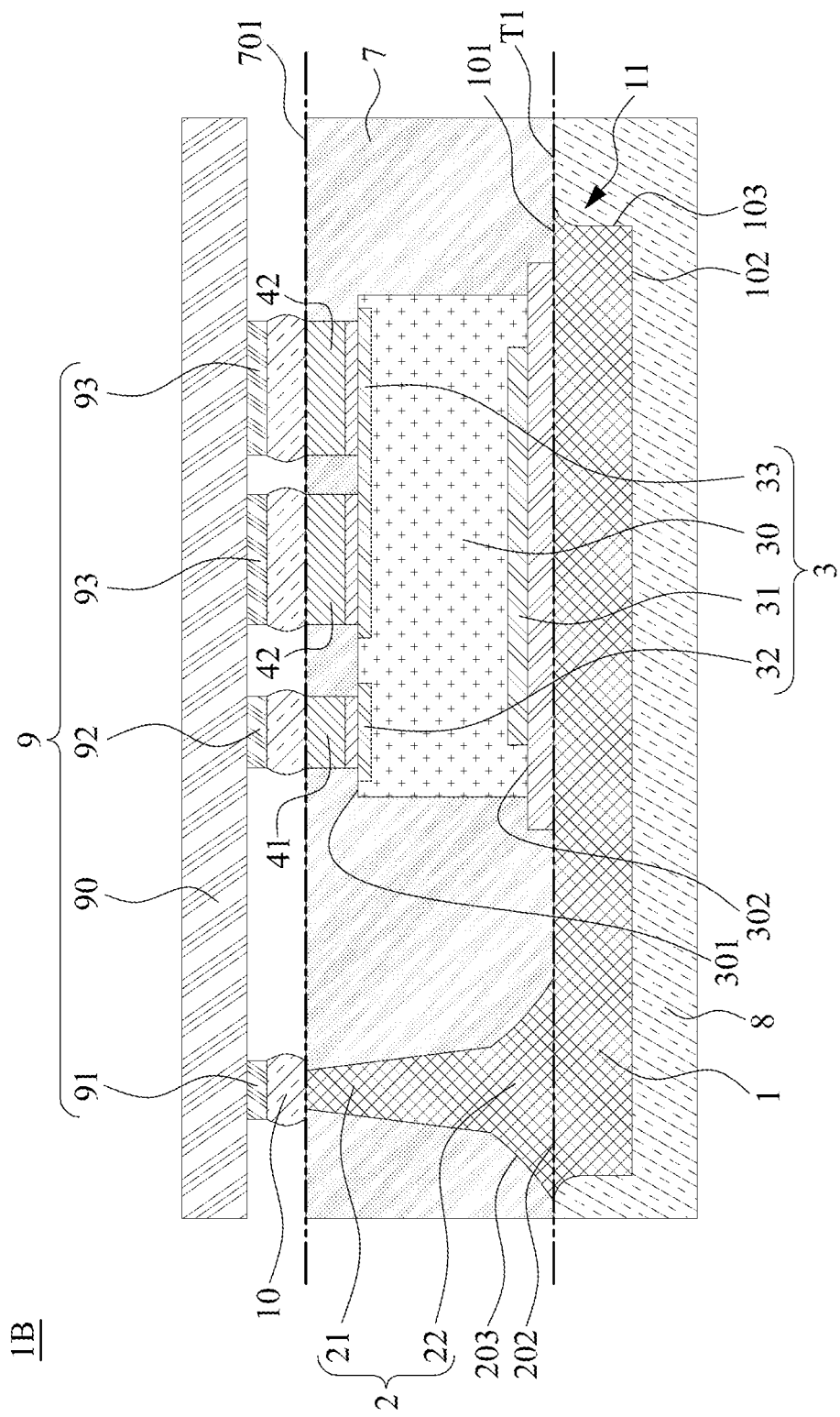
FIG. 2 illustrates a cross-sectional view of a semiconductor package structure according to some embodiments of the present disclosure.

FIG. 2 illustrates a cross-sectional view of a semiconductor package structure 1B according to some embodiments of the present disclosure. The semiconductor package structure 1B is similar to the semiconductor package structure 1A in FIG. 1, except that the semiconductor package structure 1B further includes a substrate 9 attached to the conductive post 2 and the first plurality of conductive pillars 4. The substrate 9 includes a conductive layer 90, and a first electrode 91, a second electrode 92, and a third electrode 93 each electrically connected to the conductive layer 90. The conductive layer 90 may include a plurality of conductive pads at least on the surface of the substrate 9 facing the semiconductor die 3. The conductive layer 90 may further include conductive lines routing in the substrate 9 (e.g., a printed circuit board) connecting to the plurality of conductive pads. The first electrode 91, the second electrode 92, and the third electrode 93 respectively electrically connected to the conductive post 2, the first pillar 41, and the second pillar 42 through one of a plurality of connection element 10, such that the first semiconductor die 3 is electrically connected to the substrate 9. The substrate 9 may include, for example, a PCB, such as a paper-based copper foil laminate, a composite copper foil laminate, or a polymer-impregnated glass-fiber-based copper foil laminate.

Figure 3:
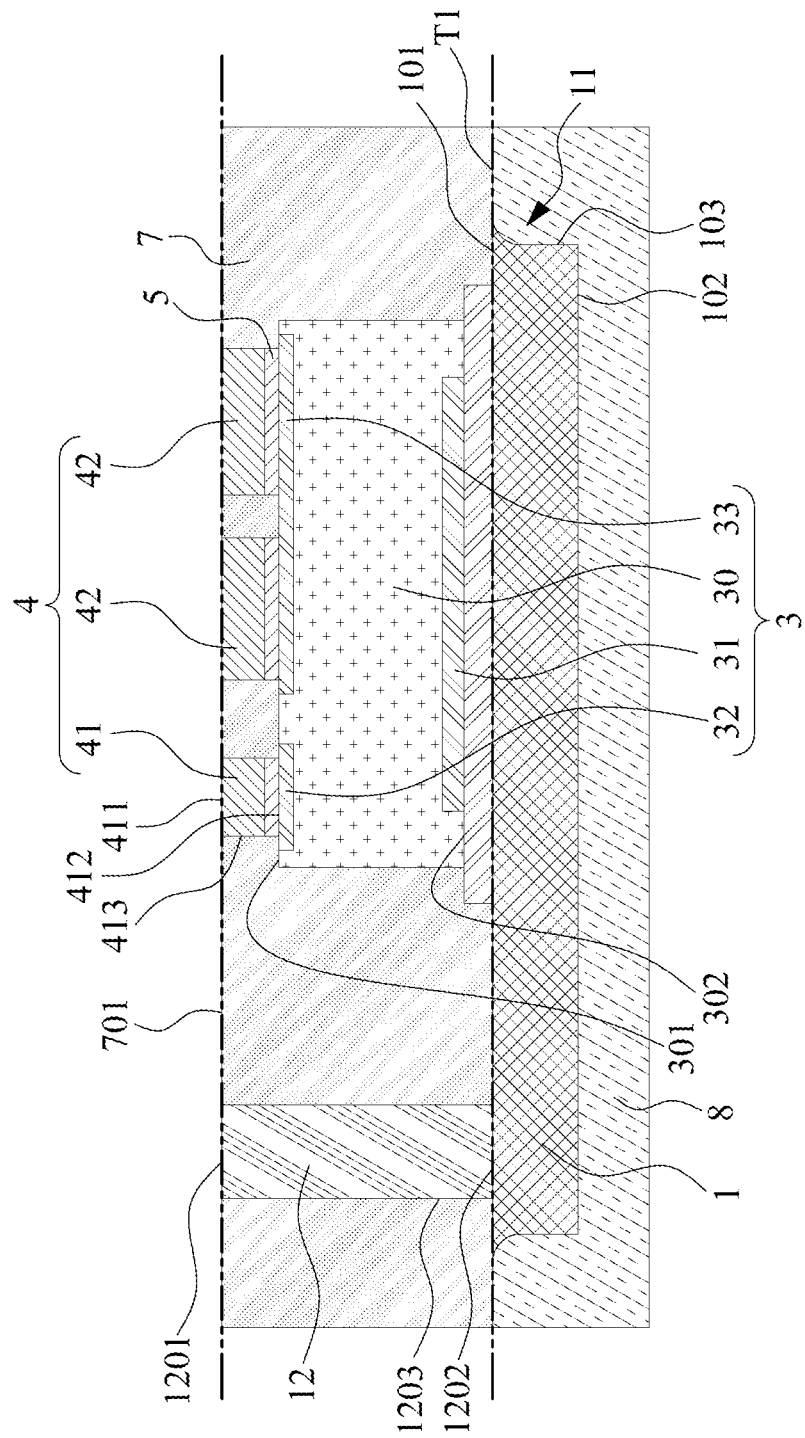
FIG. 3 illustrates a cross-sectional view of a semiconductor package structure according to some embodiments of the present disclosure.

FIG. 3 illustrates a cross-sectional view of a semiconductor package structure 1C according to some embodiments of the present disclosure. The semiconductor package structure 1C is similar to the semiconductor package structure 1A in FIG. 1, except that the conductive post 2 is replaced by a conductive post 12. The conductive post 12 may have a substantially uniform width. The conductive post 12 has a top surface 1201, a bottom surface 1202, and a lateral surface 1203 extending from the top surface 1201 to the bottom surface 1202. The top surface 1201 and the first surface 701 of the first encapsulant 7 are substantially coplanar. The bottom surface 1202 may be in contact with the first surface 101. The lateral surface 1203 may be vertical to the first surface 101. The conductive post 12 may include metal or metal alloy such as copper (Cu), gold (Au), aluminum (Al), or in alloy thereof. In some embodiments, the conductive post 12 may be formed by a patterned electroplating operation, as will be addressed in FIG. 16 to FIG. 18 of the present disclosure. In some embodiments, the conductive post 12 can be formed by a pin mount operation.

Figure 4:
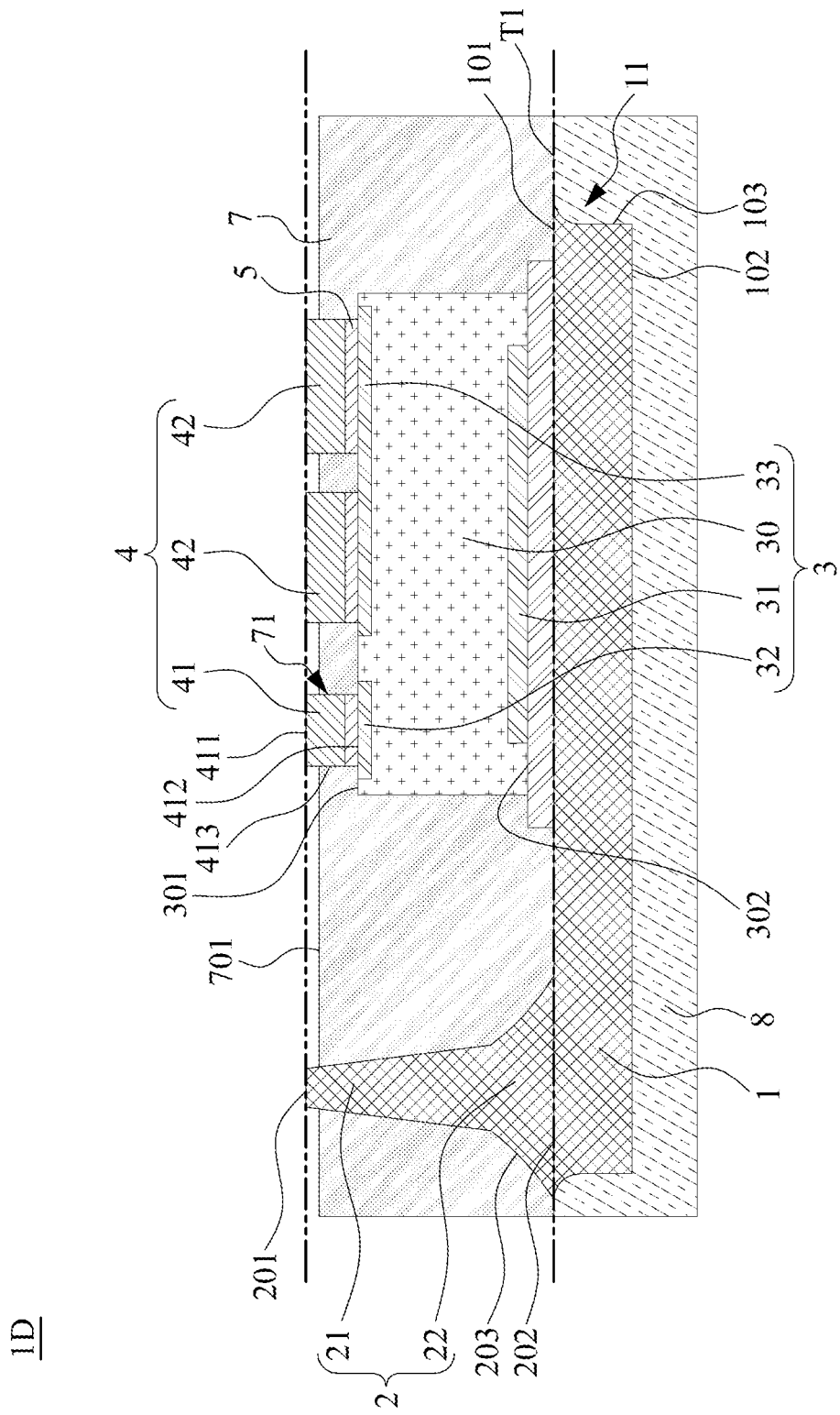
FIG. 4 illustrates a cross-sectional view of a semiconductor package structure according to some embodiments of the present disclosure.

FIG. 4 illustrates a cross-sectional view of a semiconductor package structure 1D according to some embodiments of the present disclosure. The semiconductor package structure 1D is similar to the semiconductor package structure 1A in FIG. 1, except that the first surface 411 of the first conductive pillar 4 or the top surface 201 of the conductive post 2 is protruded from the first surface 701 of the encapsulant 7. In some embodiments, the first surface 411 of the first conductive pillar 4 and the top surface 201 of the conductive post 2 are substantially coplanar or substantially at the same elevation.

Figure 5:
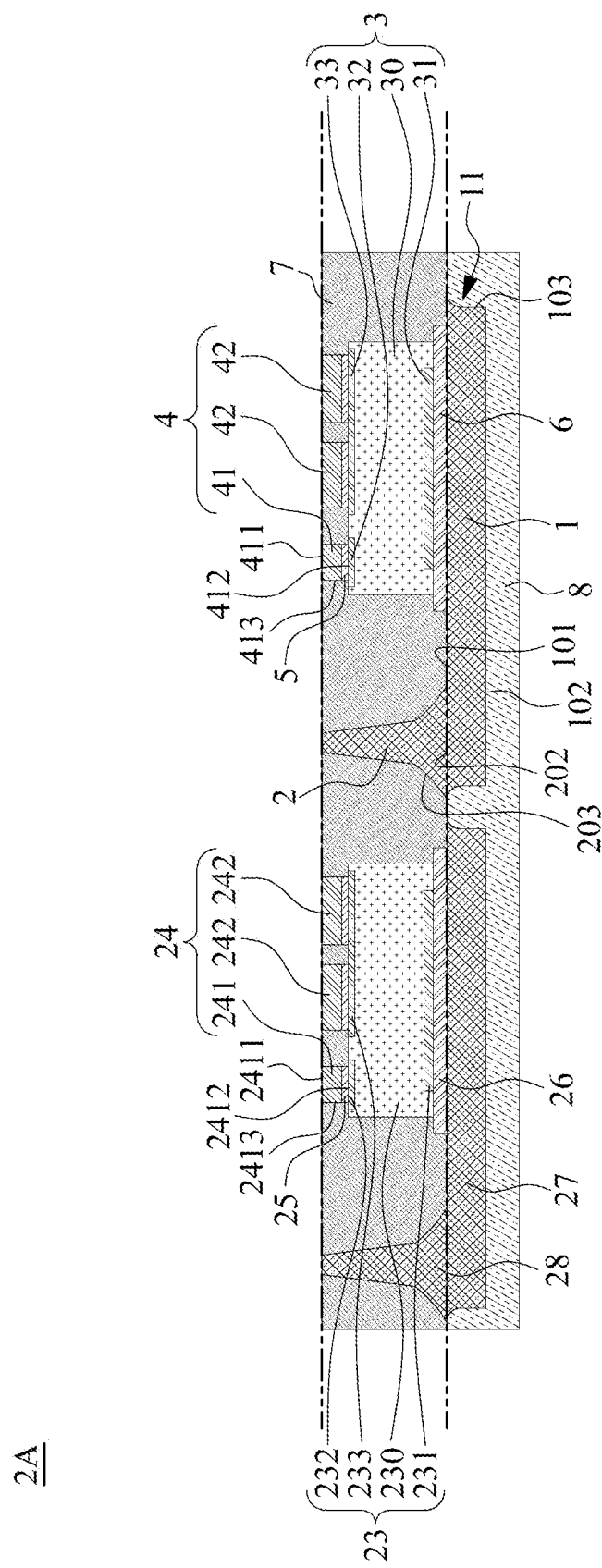
FIG. 5 illustrates a cross-sectional view of a semiconductor package structure according to some embodiments of the present disclosure.

FIG. 5 illustrates a cross-sectional view of a semiconductor package structure 2A according to some embodiments of the present disclosure. The semiconductor package structure 2A is similar to the semiconductor package structure 1A in FIG. 1, except that the semiconductor package structure 2A further includes a second semiconductor die 23, a second plurality of conductive pillars 24, a seed layer 25, an adhesive layer 26, a conductive base 27, and a conductive post 28. The seed layer 25, the adhesive layer 26, the conductive base 27, and the conductive post 28 may be similar to the seed layer 5, the adhesive layer 6, the conductive base 1, the conductive post 2, respectively.

The second semiconductor die 23 includes an active region 230, a first electrode 231, a second electrode 232, and a third electrode 233. The second plurality of conductive pillars 24 includes a first conductive pillar 241 and a second conductive pillar 242. The first electrode 231 is electrically connected to the conductive post 28 through the conductive base 27. The second electrode 232 and the third electrode 233 are electrically connected to the first pillar 241 and the second pillar 242, respectively. The first semiconductor die 3 and the second semiconductor die 23 are configured to electrically connect to each other in series or in parallel through an external substrate. For example, the conductive post 2 and the second conductive pillar 242 of the second plurality of conductive pillars 24 are configured to electrically connect to the external substrate. Prior to connect to the external substrate, the first semiconductor die 3 and the second semiconductor die 23 are electrically isolated to each other, such that no known good semiconductor die is risked in the package assembly steps.

In some comparative embodiments, multiple semiconductor chips are electrically connected with each other through the RDL structure disposed thereon. Such an implementation may highly impact the packaging yield since the RDL structure probably inherits some electrical faults, which in turn destroy the connection between the semiconductor dies. In the present disclosure, the semiconductor dies are electrically connected through the conductive patterns on the external substrate, as illustrated in FIG. 6 and FIG. 7, so no known good die is risked in the package assembly steps.

Figure 6:
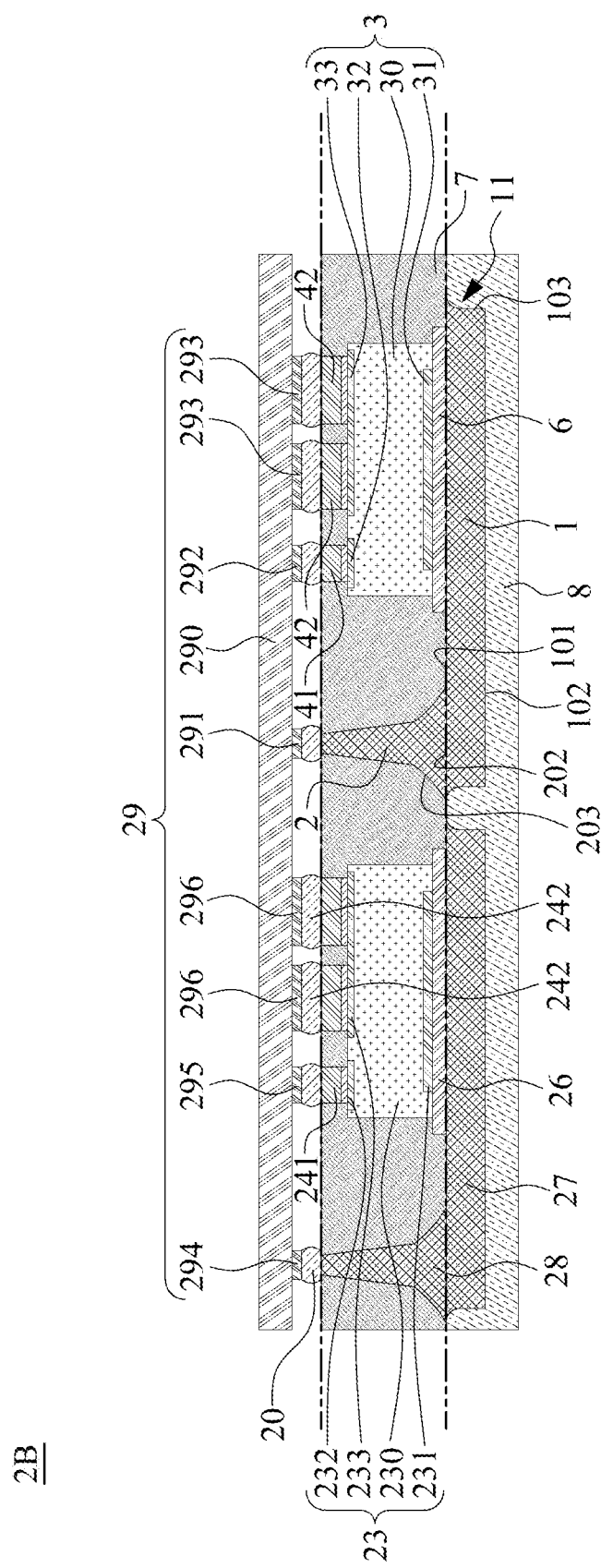
FIG. 6 illustrates a cross-sectional view of a semiconductor package structure according to some embodiments of the present disclosure.

FIG. 6 illustrates a cross-sectional view of a semiconductor package structure 2B according to some embodiments of the present disclosure. The semiconductor package structure 2B is similar to the semiconductor package structure 2A in FIG. 5, except that the semiconductor package structure 2B further includes a substrate 29 disposed on the first semiconductor die 3 and the second semiconductor die 4. The substrate 29 includes a conductive layer 290, and a first electrode 291, a second electrode 292, a third electrode 293, a fourth electrode 294, a fifth electrode 295, and a sixth electrode 296 each electrically connected to the conductive layer 290. The first electrode 91, the second electrode 92, the third electrode 93, the fourth electrode 294, the fifth electrode 295, and the sixth electrode 296 respectively electrically connected to the conductive post 2, the first pillar 41, the second pillar 42, the conductive post 28, the first pillar 241, and the second pillar 242 through one of a plurality of connection element 20. The substrate 29 may include, for example, a PCB, such as a paper-based copper foil laminate, a composite copper foil laminate, or a polymer-impregnated glass-fiber-based copper foil laminate. The conductive post 2 and the second electrode 242 may be electrically connected through the first electrode 291, the conductive layer 290, and the sixth electrode 296, such that the first semiconductor die 3 and the second semiconductor die 23 are electrically connected.

Figure 7:
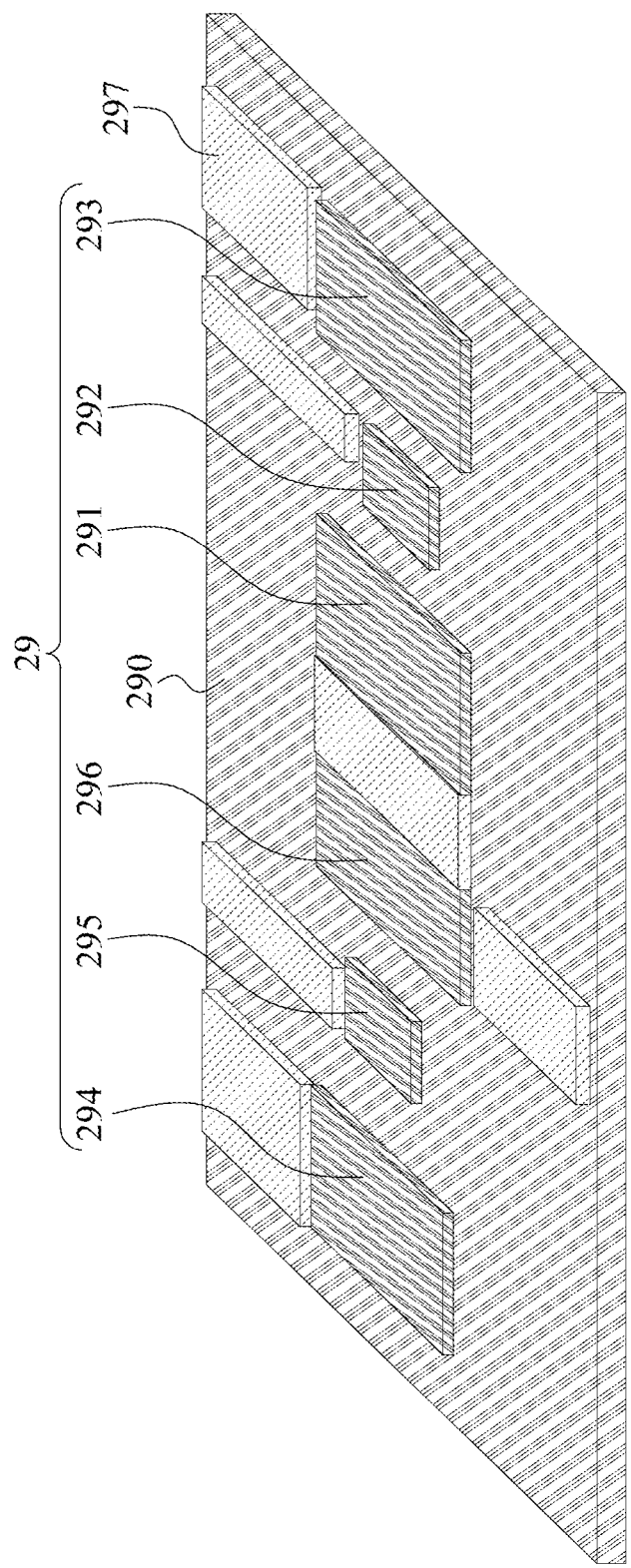
FIG. 7 illustrates a perspective view of a substrate according to some embodiments of the present disclosure.

FIG. 7 illustrates a perspective view of the substrate 29 according to some embodiments of the present disclosure. Referring to FIG. 6 and FIG. 7, the substrate 29 further includes a resist layer 297 disposed on the conductive layer 290. In some embodiments, the resist layer 297 can be disposed between adjacent electrodes (for example, the first electrode 291 and the sixth electrode 296) to prevent the solder merge after the bonding of the semiconductor package structure.

FIG. 8 through FIG. 15 illustrate a method for manufacturing a semiconductor package structure according to some embodiments of the present disclosure. In some embodiments, the method is for manufacturing the semiconductor package structure 1A shown in FIG. 1.

Figure 8:
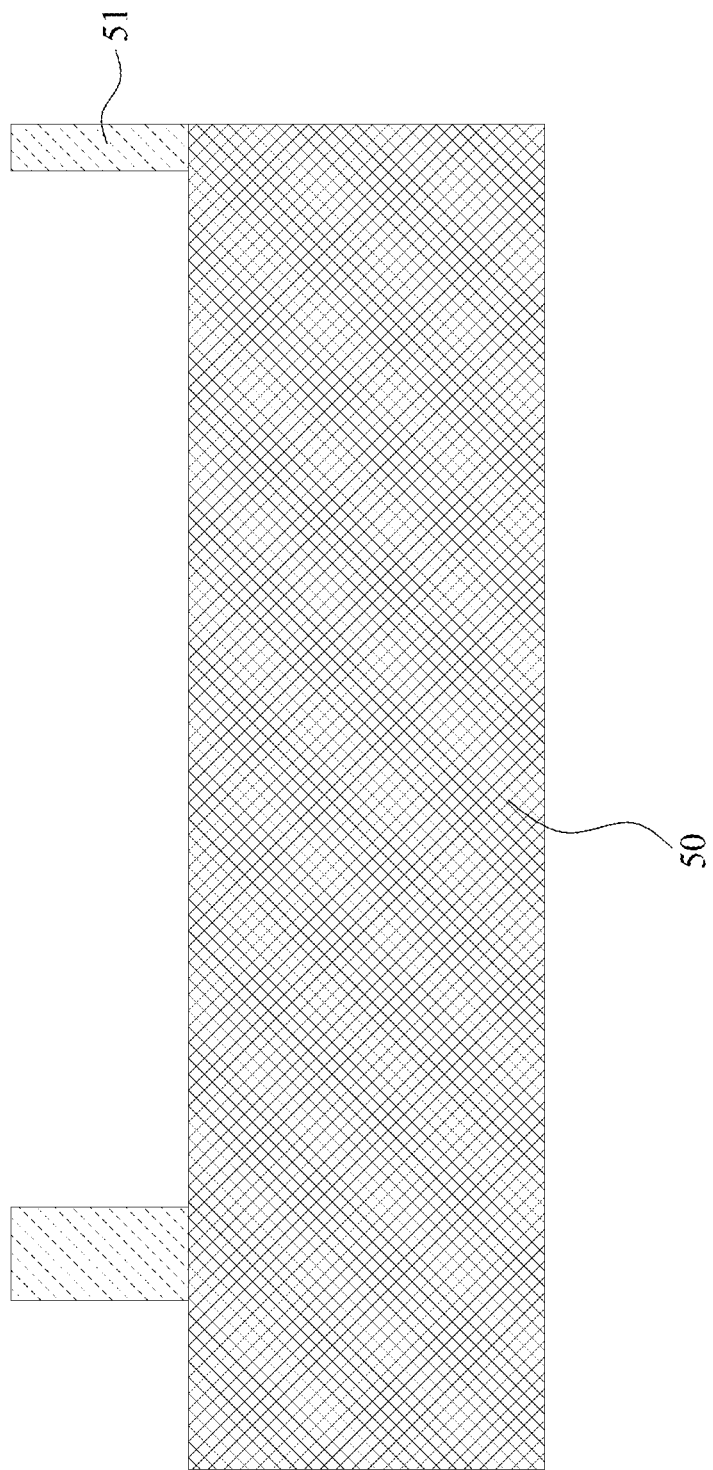
FIG. 8 illustrates one or more stages of an example of a method for manufacturing a semiconductor package structure according to some embodiments of the present disclosure.
Figure 9:
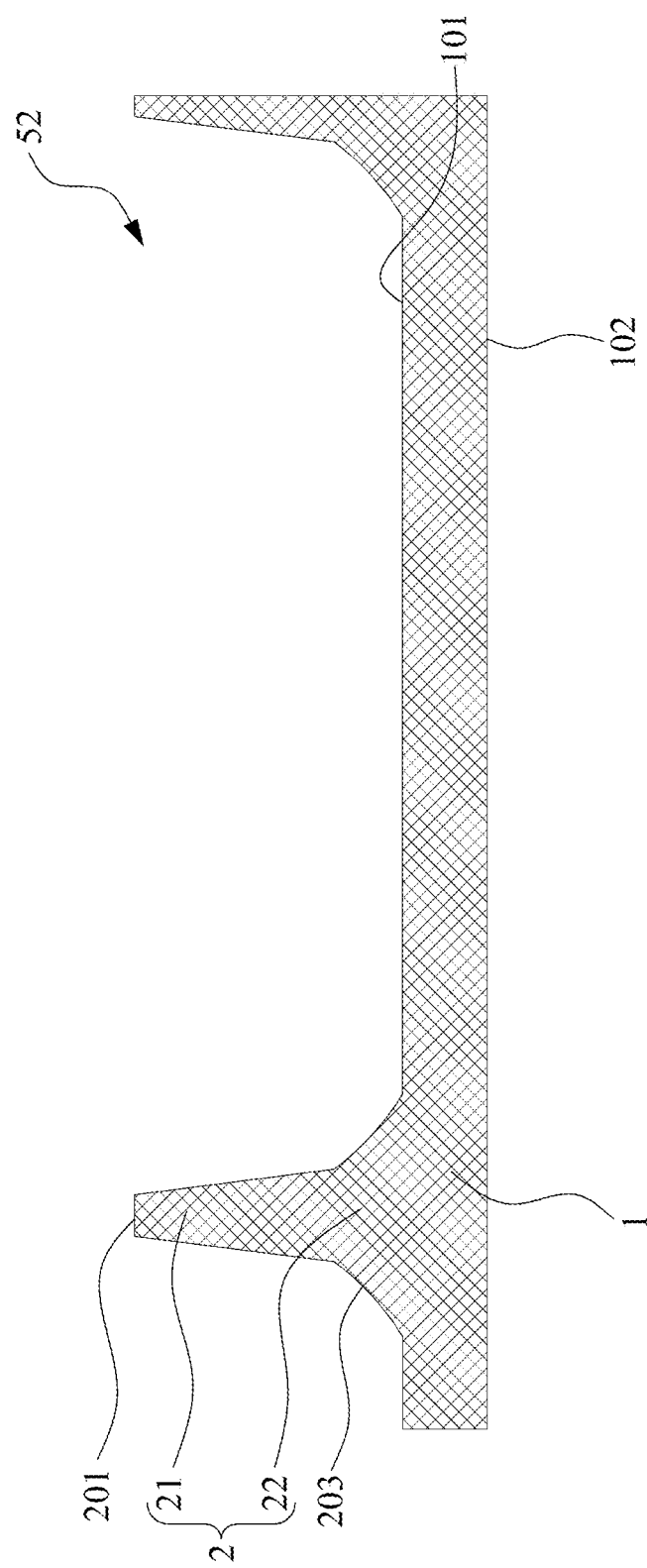
FIG. 9 illustrates one or more stages of an example of a method for manufacturing a semiconductor package structure according to some embodiments of the present disclosure.

Referring to FIG. 8, a conductive base material 50 is provided and a coating layer 51 is formed and patterned on the conductive base material 50. In some embodiments, the coating layer 51 may include a photoresist material. In some embodiments, the coating layer 51 may include a metal material different from the conductive base material 50 or at least having different etching selectivity from the base material 50. Referring to FIG. 9, when the coating layer 51 is composed of photoresist material, the conductive base material 50 is half etched to form a conductive base 1 having a first surface 101 and a second surface 102. The coating layer 51 is then removed. The conductive base 1 has a conductive post 2 having a top surface 201 and a lateral surface 203. The first surface 101 of the conductive base 1 and the lateral surface 203 of the conductive post 2 define a space 52. The first surface 101 may be substantially flat surface or may be a curved surface. The lateral surface 203 may be curved surface or an inwardly dished surface. Depending on the etching process, the curvature of the lateral surface 203 may be constant or varied. The conductive post 2 includes a top portion 21 away from the conductive base 1 and a bottom portion 22 close to the conductive base 1. The bottom portion 22 may have a width greater than that of the top portion 21.

Figure 10:
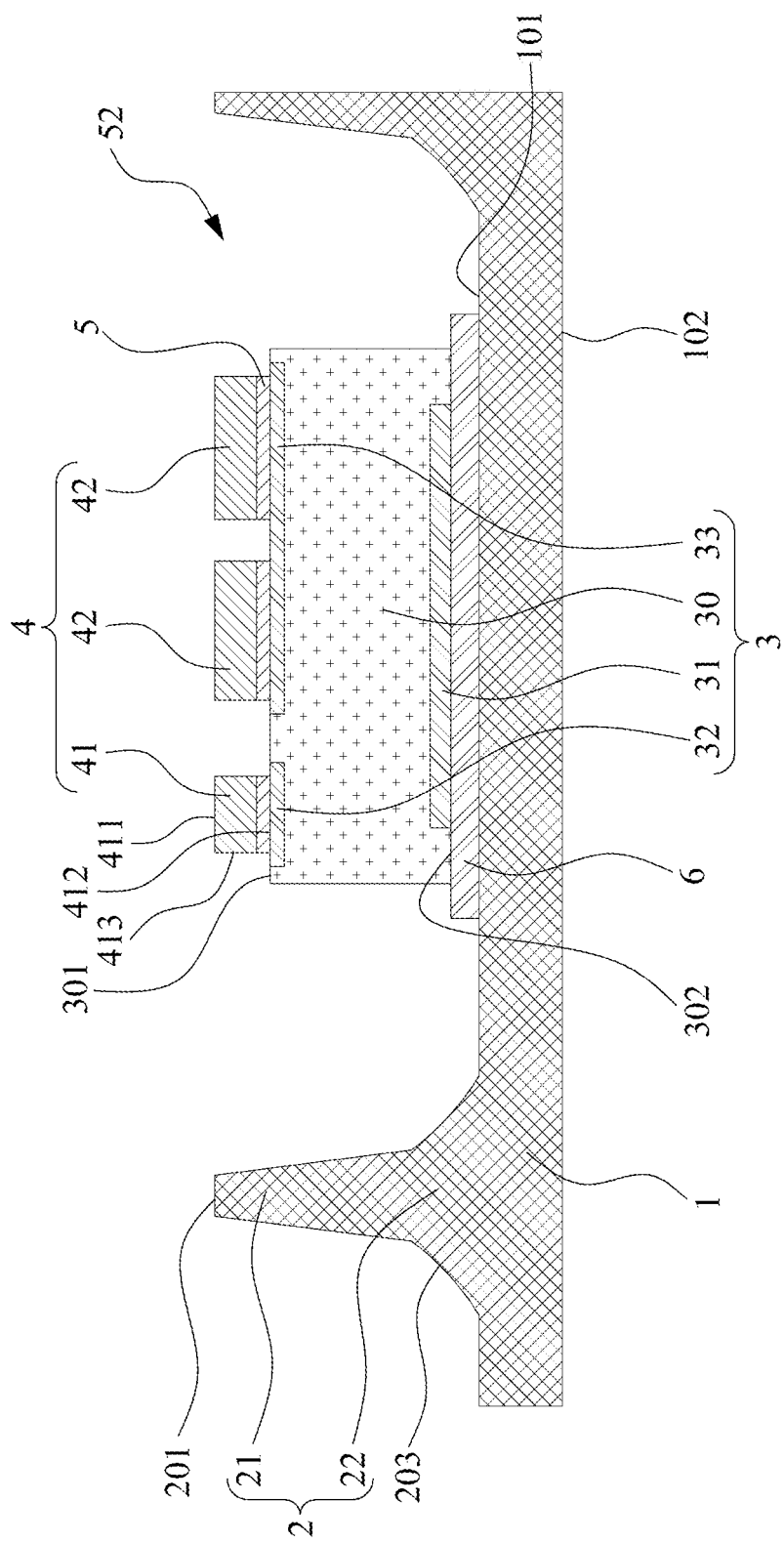
FIG. 10 illustrates one or more stages of an example of a method for manufacturing a semiconductor package structure according to some embodiments of the present disclosure.

Referring to FIG. 10, a first semiconductor die 3 is attached to the first surface 101 of the conductive base 1 through an adhesive layer 6. The first semiconductor die 3 is within the space 52. The first semiconductor die 3 has a first surface 301 and a second surface 302. The first semiconductor die 3 includes an active region 30, a first electrode 31 adjacent to the second surface 302, and a second electrode 32 and third electrode 33 adjacent to the first surface 301. The first electrode 31 is electrically connected to the conductive base 1 through the adhesive layer 6. The first semiconductor die 3 includes a first plurality of conductive pillar 4. The first plurality of conductive pillar 4 includes a first conductive pillar 41 and a second conductive pillar 42, which are electrically connected to the second electrode 32 and third electrode 33, respectively. The first conductive pillar 41 or the second conductive pillar 42 may have a uniform width. The first conductive pillar 41 has a first surface 411 (e.g., a top surface), a second surface 412 (e.g., a bottom surface), and a lateral surface 413 extending from the first surface 411 and the second surface 412. Still referring to FIG. 10, a seed layer 5 is formed between each of the first plurality of conductive pillars 4 and the first semiconductor die 3. For example, the seed layer 5 is formed between the bottom surface 412 of the first conductive pillar 41 and the first surface 301 of the semiconductor die 3. On the other hand, the first conductive pillar 41 may be free from a buffer layer or a seed layer along the lateral surface 413.

Figure 11:
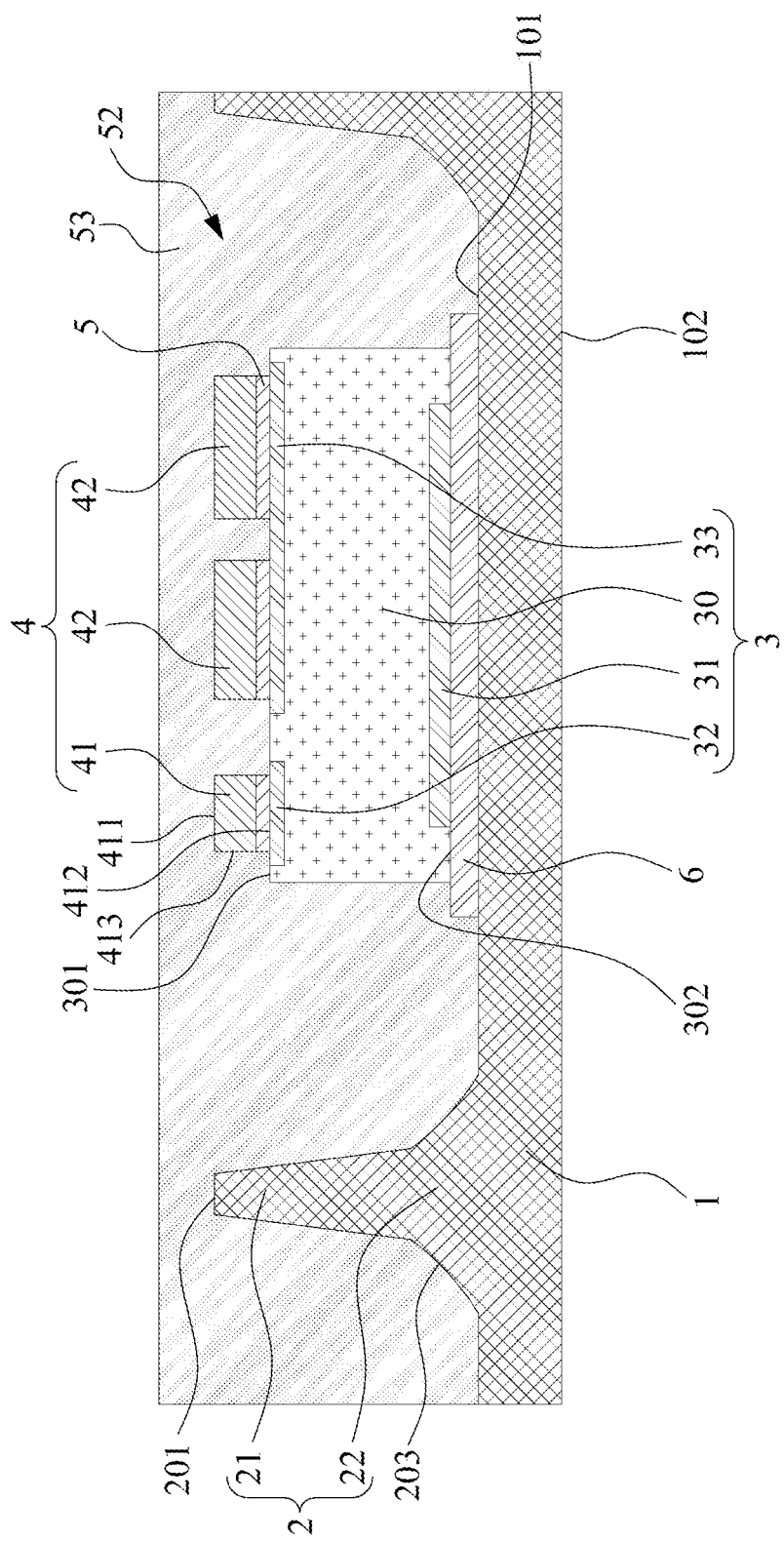
FIG. 11 illustrates one or more stages of an example of a method for manufacturing a semiconductor package structure according to some embodiments of the present disclosure.

Referring to FIG. 11, a encapsulating material 53 is formed on the conductive base 1 to encapsulate the conductive post 2, the first semiconductor die 3.

Figure 12:
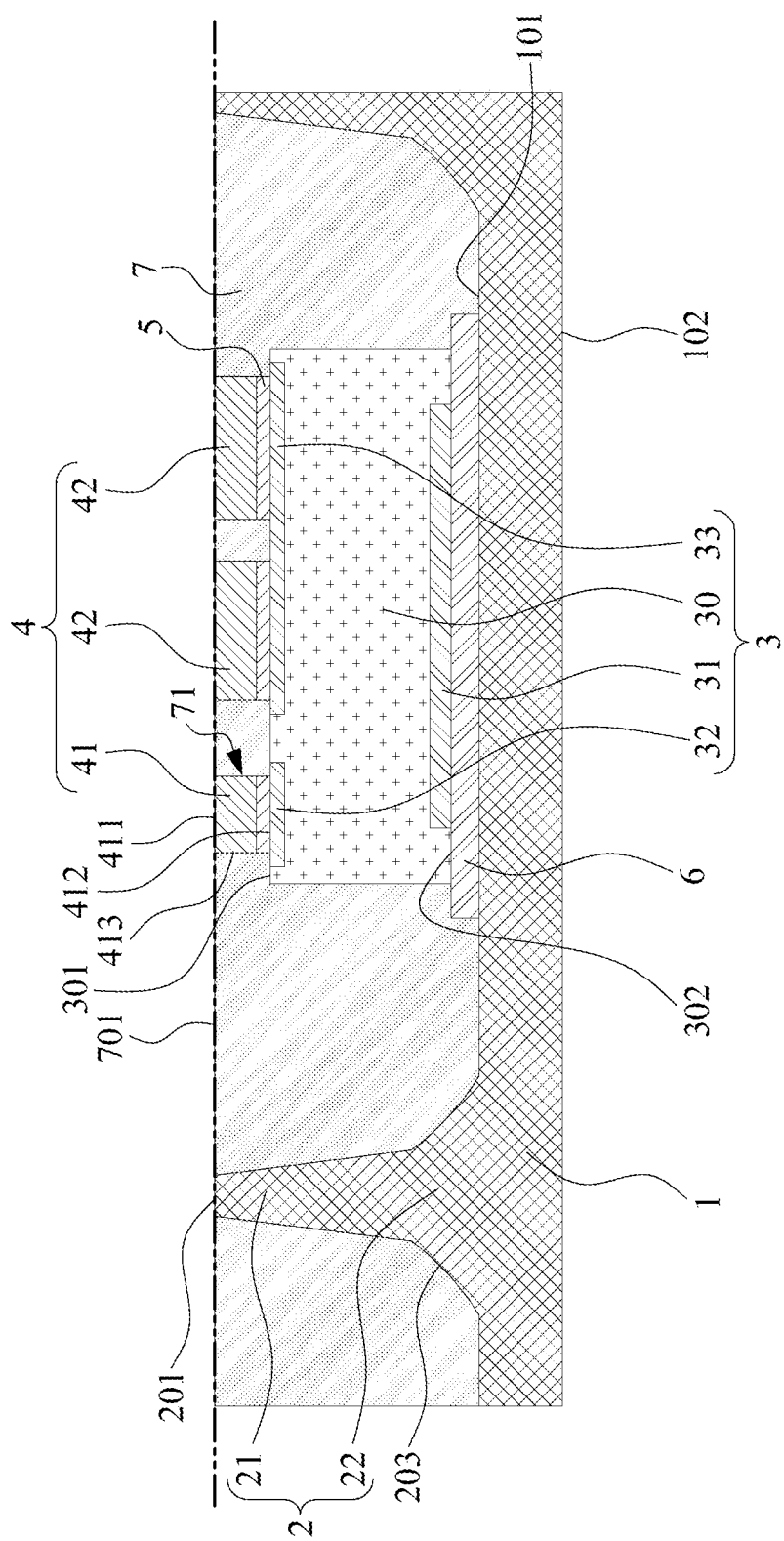
FIG. 12 illustrates one or more stages of an example of a method for manufacturing a semiconductor package structure according to some embodiments of the present disclosure.

Referring to FIG. 12, the encapsulating material 53 is grinded to form a first encapsulant 7 having a first surface 701 (e.g., a top surface) away from the conductive base 1. The first surface 701 of the first encapsulant 7, the top surface 201 of the conductive post 2, and/or the first surface 411 of the first conductive pillar 41 are substantially coplanar.

Still referring to FIG. 12, the first of plurality conductive pillars 4 is implemented before the first encapsulant 7 is formed, resulting that the first encapsulant 7 may include one or more openings defined by the first plurality of conductive pillars 40. For example, the first encapsulant 7 includes an opening 71 defined by the first pillar 41. The roughness of a side surface of the opening 71 is defined by the lateral surface 413 of the first conductive pillar 41. As shown in FIG. 12, the first conductive pillar 41 is free from possessing a lateral extension portion between the top surface 411 and the bottom surface 412.

Figure 13:
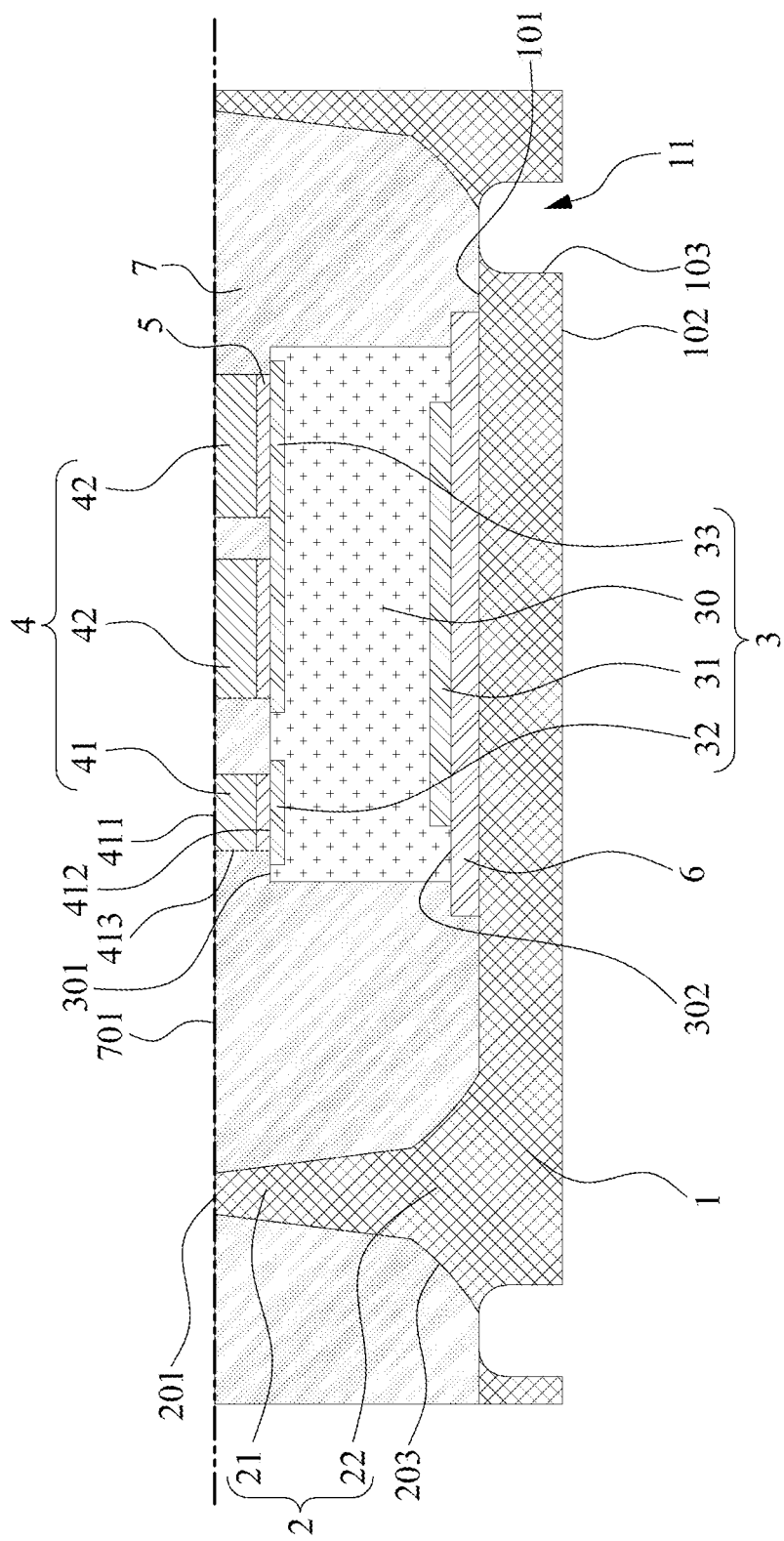
FIG. 13 illustrates one or more stages of an example of a method for manufacturing a semiconductor package structure according to some embodiments of the present disclosure.

Referring to FIG. 13, the conductive base 1 is etched from the second surface 102 to form a curved surface 103. The curved surface 103 defines a region 11. The curved surface 103 may extend from the first surface 101 to the second surface 102.

Figure 14:
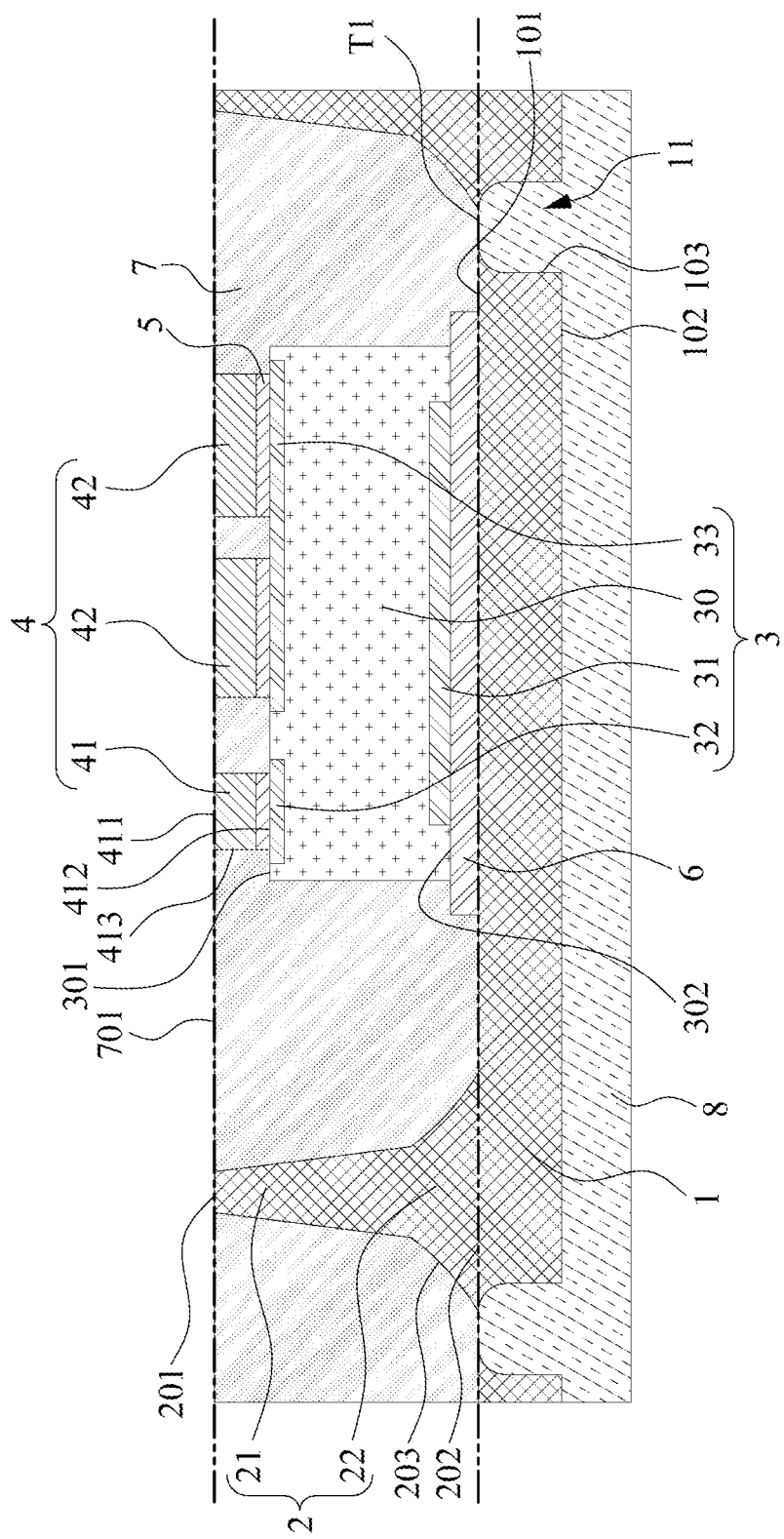
FIG. 14 illustrates one or more stages of an example of a method for manufacturing a semiconductor package structure according to some embodiments of the present disclosure.

Referring to FIG. 14, a second encapsulant 8 is formed on the second surface 102 by, for example, a molding process. A portion of the second encapsulant 8 is in contact with the curved surface 103. The semiconductor package structure further includes an interface T1 between the first encapsulant 7 and the second encapsulant 8. In some embodiments, the interface T1 is substantially at the same elevation with the first surface 101 of the conductive base 1. In some embodiments, the second encapsulant 8 may entirely cover the second surface 102 to prevent from exposing the conductive base 1.

Figure 15:
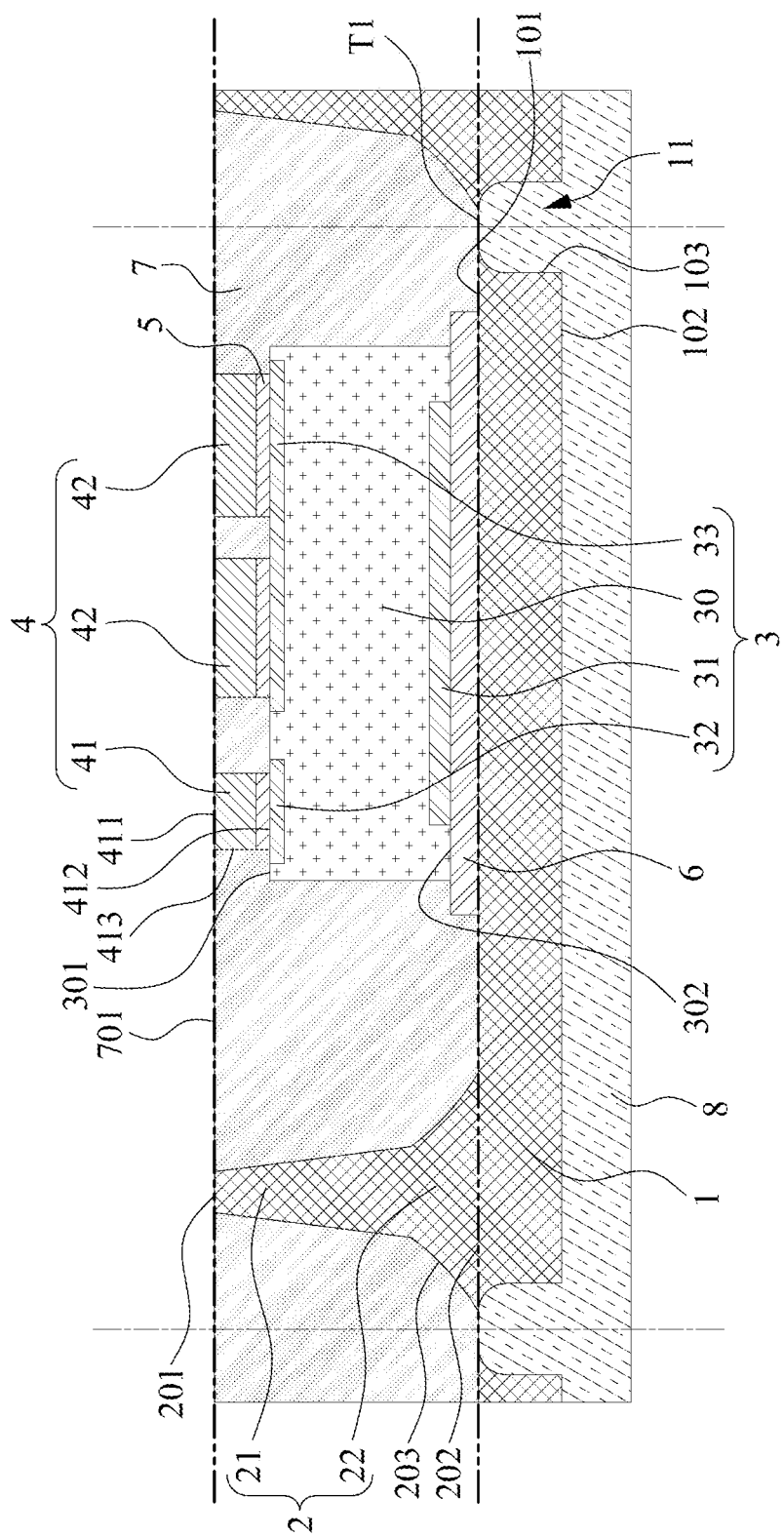
FIG. 15 illustrates one or more stages of an example of a method for manufacturing a semiconductor package structure according to some embodiments of the present disclosure.

Referring to FIG. 15, a singulation process is performed to form the semiconductor package structure 1A shown in FIG. 1. In some embodiments, the semiconductor package structure 1A may be attached to a substrate before or after the singulation process as illustrated in FIG. 15.

Figure 16:
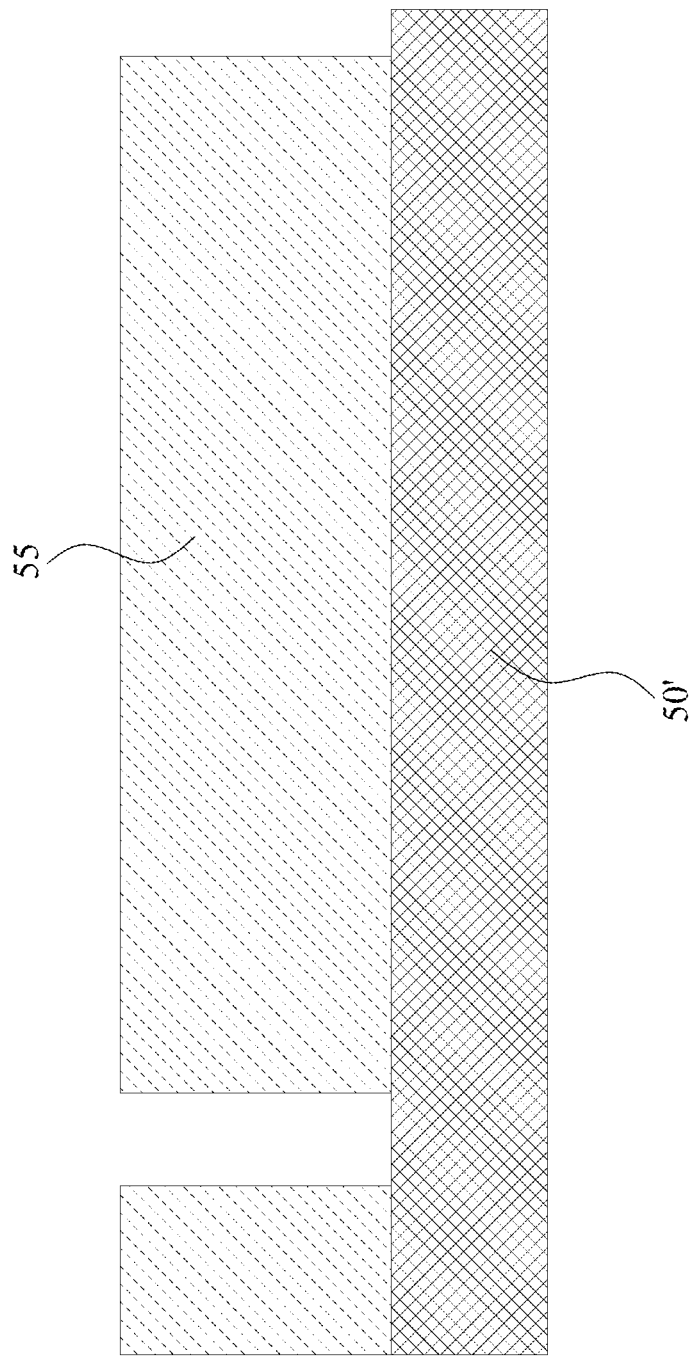
FIG. 16 illustrates one or more stages of an example of a method for manufacturing a semiconductor package structure according to some embodiments of the present disclosure.
Figure 17:
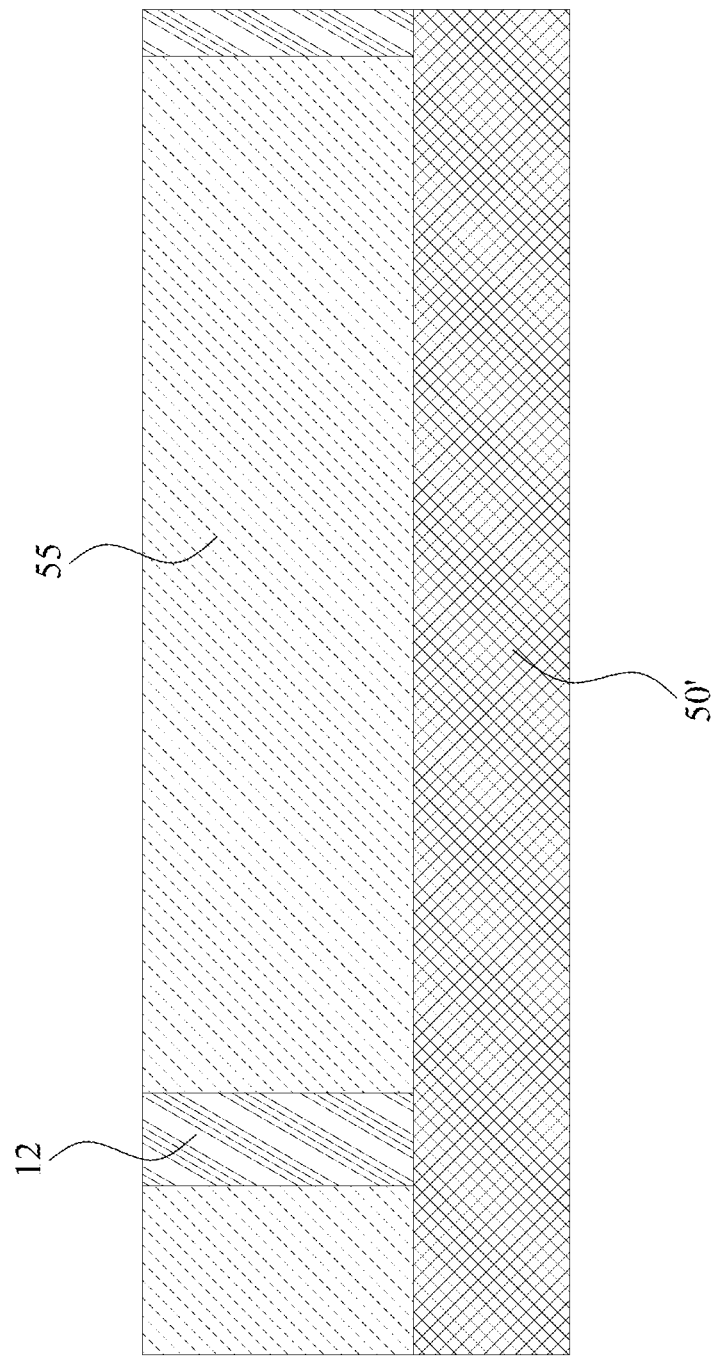
FIG. 17 illustrates one or more stages of an example of a method for manufacturing a semiconductor package structure according to some embodiments of the present disclosure.
Figure 18:
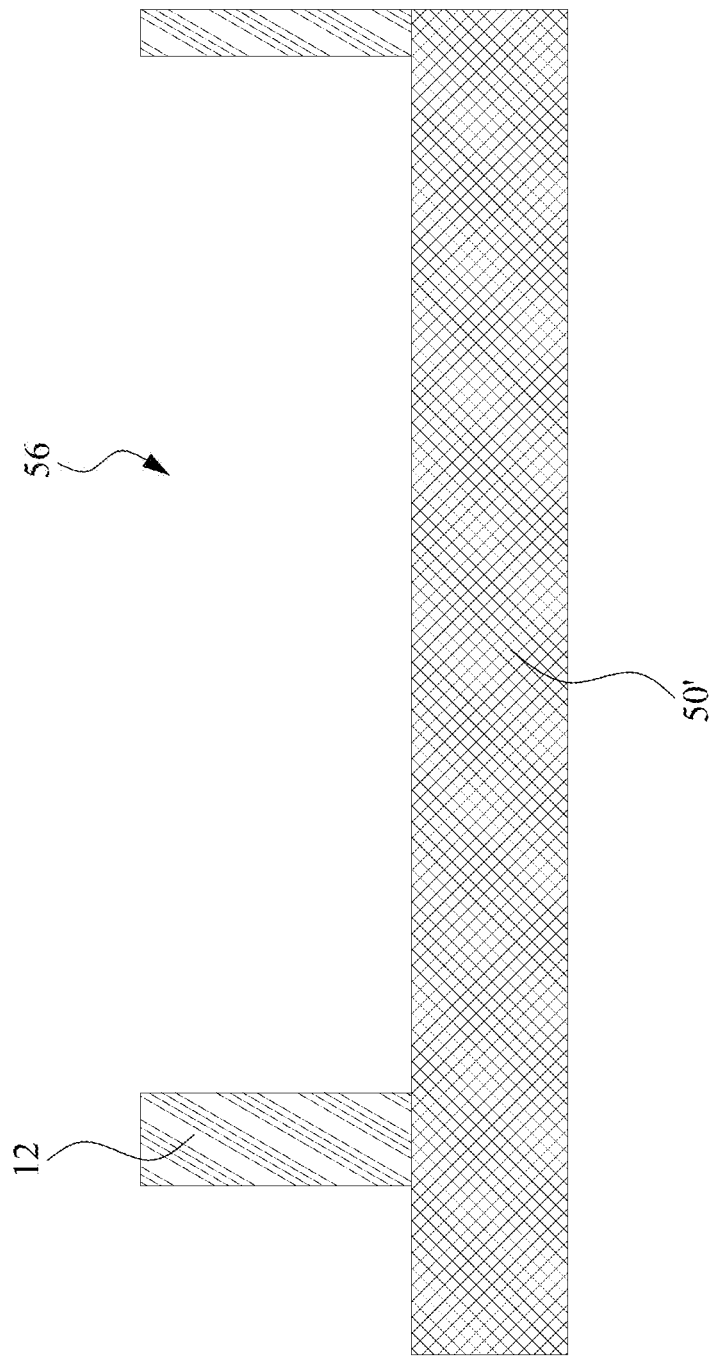
FIG. 18 illustrates one or more stages of an example of a method for manufacturing a semiconductor package structure according to some embodiments of the present disclosure.

FIG. 16 through FIG. 18 illustrate one or more stages of an example of a method for manufacturing a semiconductor package structure according to some embodiments of the present disclosure. In some embodiments, the method is for manufacturing the semiconductor package structure 1C shown in FIG. 3.

Referring to FIG. 16, a conductive base 50' is provided and a photoresist layer 55 is formed and patterned on the conductive base 50. Referring to FIG. 17 a conductive post 12 is formed on conductive base 50' by, for example, an electroplating process. In an alternative embodiment, the conductive post 12 may be a pre-formed conductive post and then be attached to the conductive base 50'.

Referring to FIG. 18, the photoresist layer 55 is removed by, for example, an etching process. Afterwards, one or more stages in FIG. 10 through FIG. 15 may be performed to form the semiconductor package structure 1C shown in FIG. 3.

Figure 19:
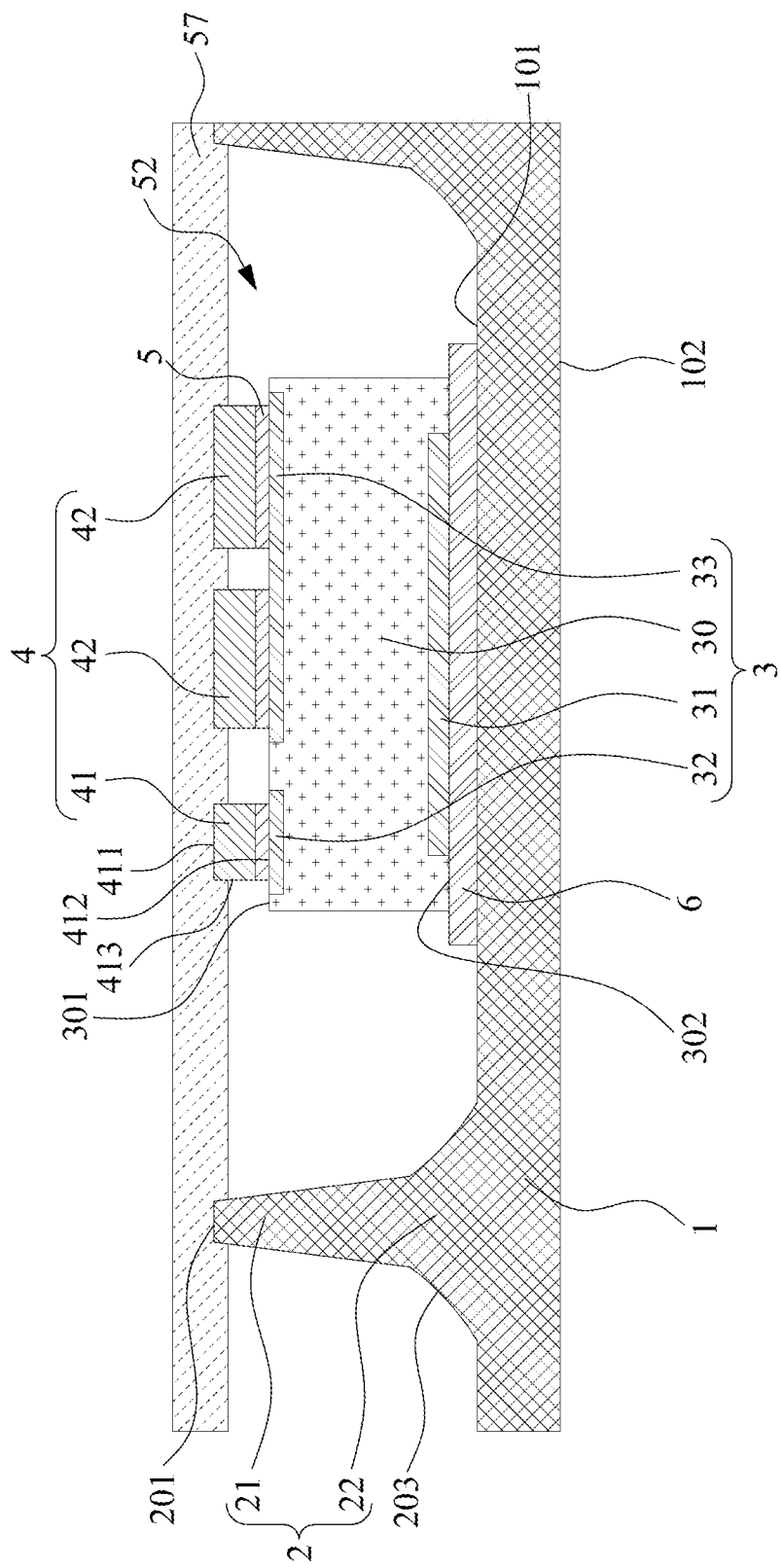
FIG. 19 illustrates one or more stages of an example of a method for manufacturing a semiconductor package structure according to some embodiments of the present disclosure.
Figure 20:
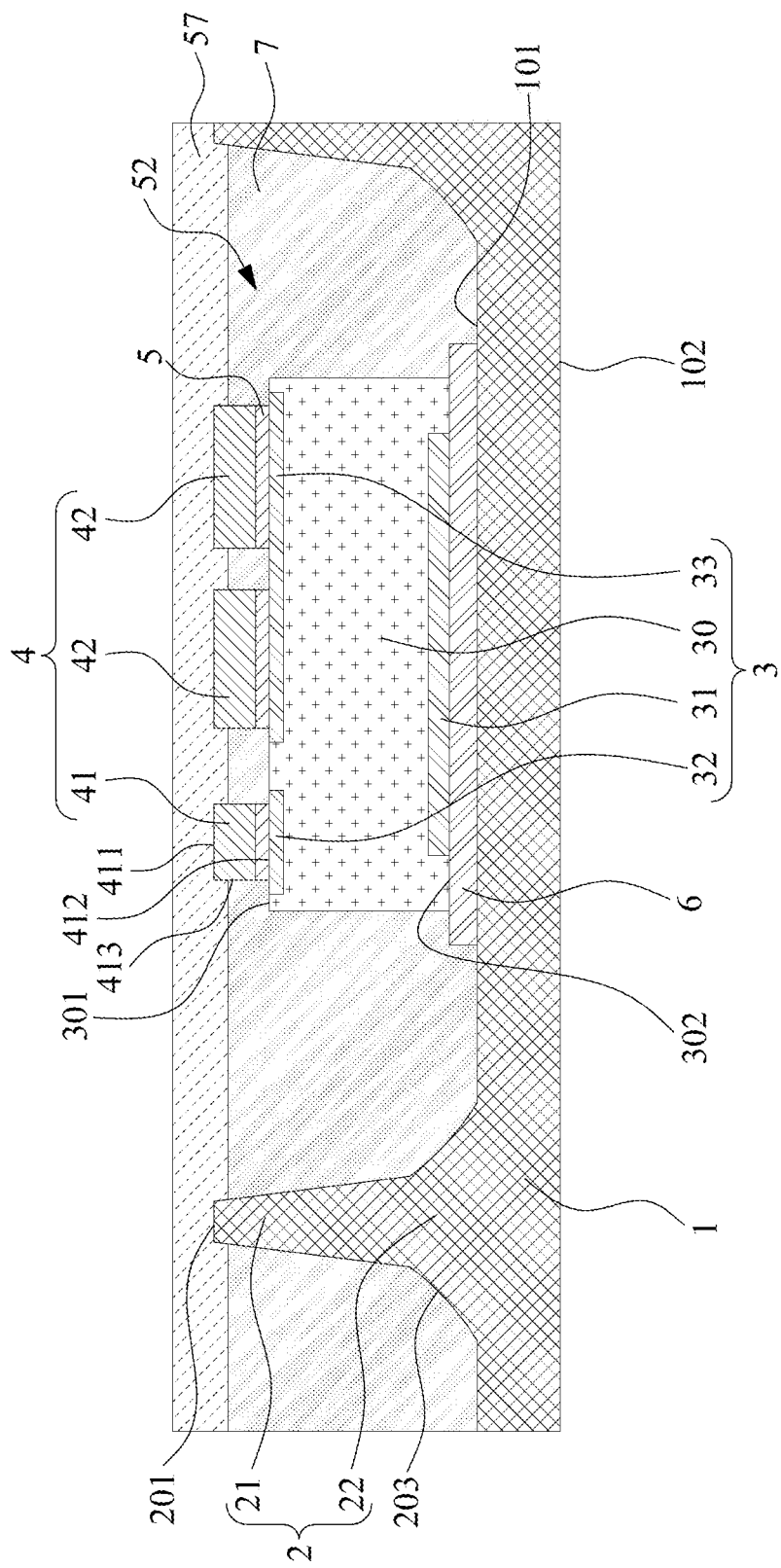
FIG. 20 illustrates one or more stages of an example of a method for manufacturing a semiconductor package structure according to some embodiments of the present disclosure.
Figure 21:
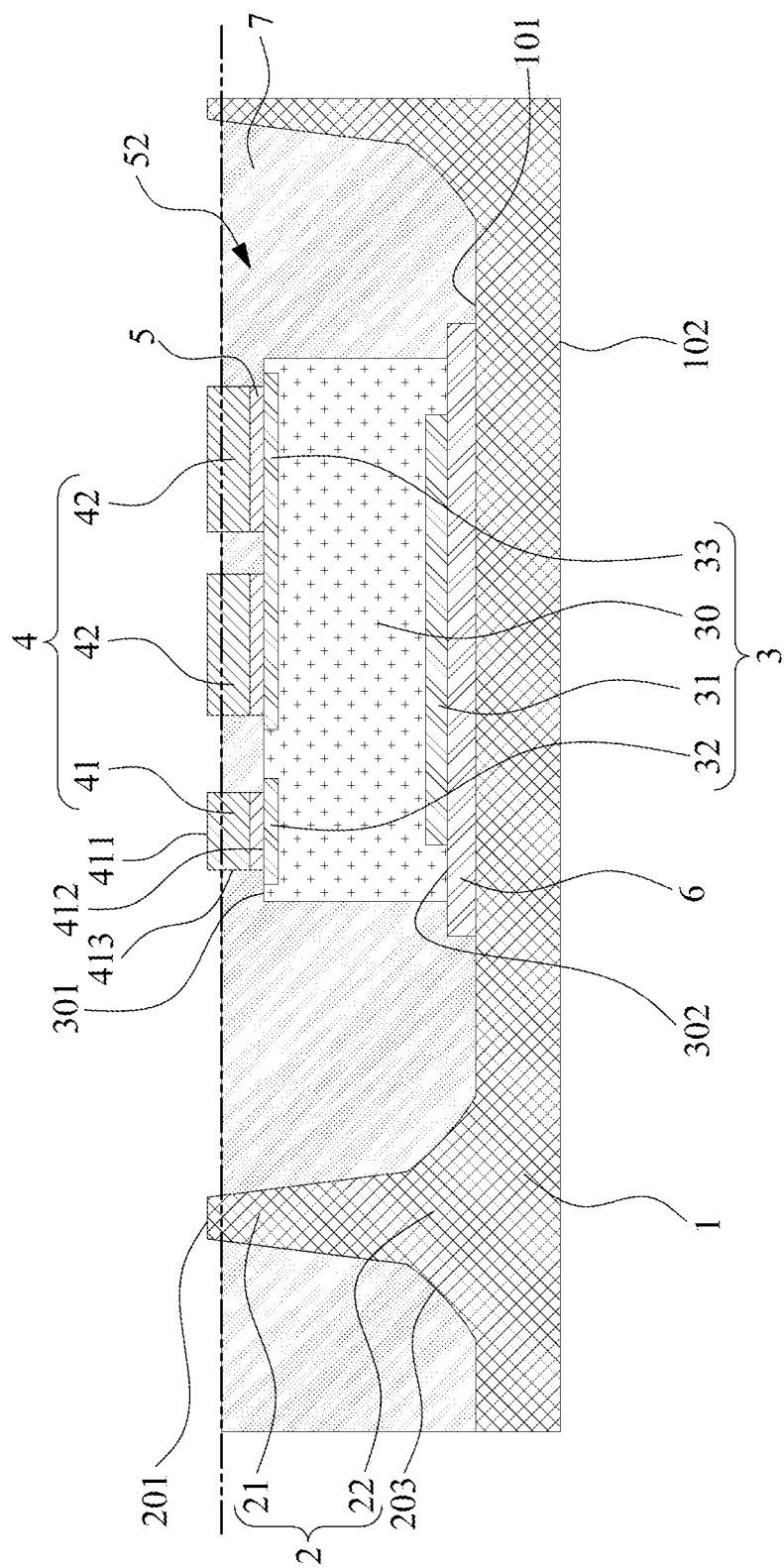
FIG. 21 illustrates one or more stages of an example of a method for manufacturing a semiconductor package structure according to some embodiments of the present disclosure.

FIG. 19 through FIG. 21 illustrate one or more stages of an example of a method for manufacturing a semiconductor package structure according to some embodiments of the present disclosure. In some embodiments, the method is for manufacturing the semiconductor package structure 1D shown in FIG. 4. The initial stages of the illustrated process are the same as, or similar to, the stages illustrated in FIG. 8 to FIG. 10. FIG. 19 depicts a stage subsequent to that depicted in FIG. 10.

Referring to FIG. 19, a film 57 is attached to the conductive post 2 and the first plurality of conductive pillars 4 to cover the top surface 201 and the first surface 411 of the first conductive pillar 41. The film 57 includes flexible material so that the film 57 may clad a top section of the lateral surface 203 of the conductive post 2 and a top section of the lateral surface 413 of the first conductive pillar 41. As previously discussed when addressing FIG. 8, the coating layer 51 may be composed of metal material different from the conductive base material 50 or at least having different etching selectivity from the base material 50. Such coating layer 51 may be remained after the half-etching of the base material 50, and this configuration is especially suitable for performing the film molding operation as described in FIG. 19, FIG. 20, and FIG. 21.

Referring to FIG. 20, an encapsulant 7 is formed to surround the conductive post 1 and the first semiconductor die 3 by, for example, a molding process. Referring to FIG. 21, the film 57 is subsequently removed. Since the top section of the first conductive pillar 41 is cladded with the film 57 prior to the encapsulation, the top section including the first surface 411 of the first conductive pillar 41 is protruded from the first surface 701 of the first encapsulant 7. The same protrusion structures can be observed on the second conductive pillar 42 and the conductive post 2.

FIG. 22 through FIG. 26 illustrate one or more stages of an example of a method for manufacturing a semiconductor die according to some embodiments of the present disclosure. In some embodiments, the method is for manufacturing the first semiconductor die 3 shown in FIG. 1.

Figure 22:
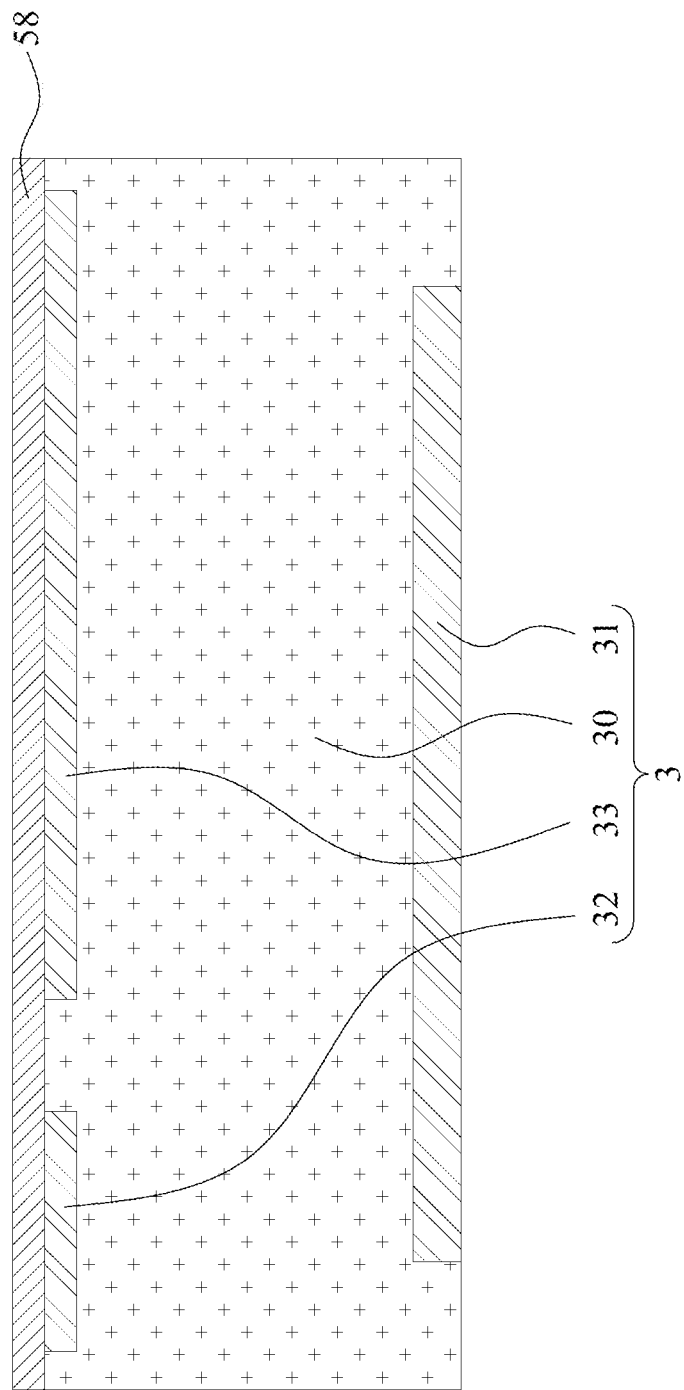
FIG. 22 illustrates one or more stages of an example of a method for manufacturing a semiconductor die according to some embodiments of the present disclosure.
Figure 23:
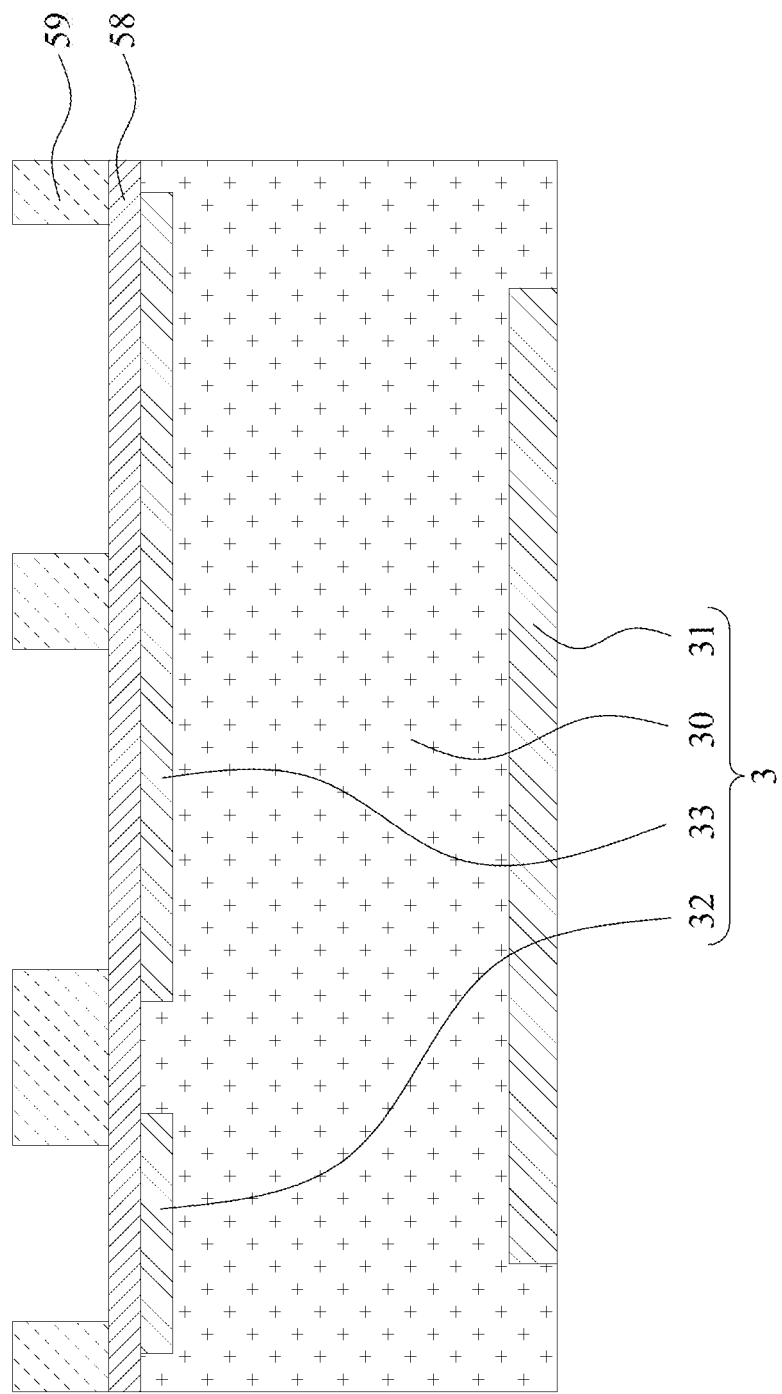
FIG. 23 illustrates one or more stages of an example of a method for manufacturing a semiconductor die according to some embodiments of the present disclosure.
Figure 24:
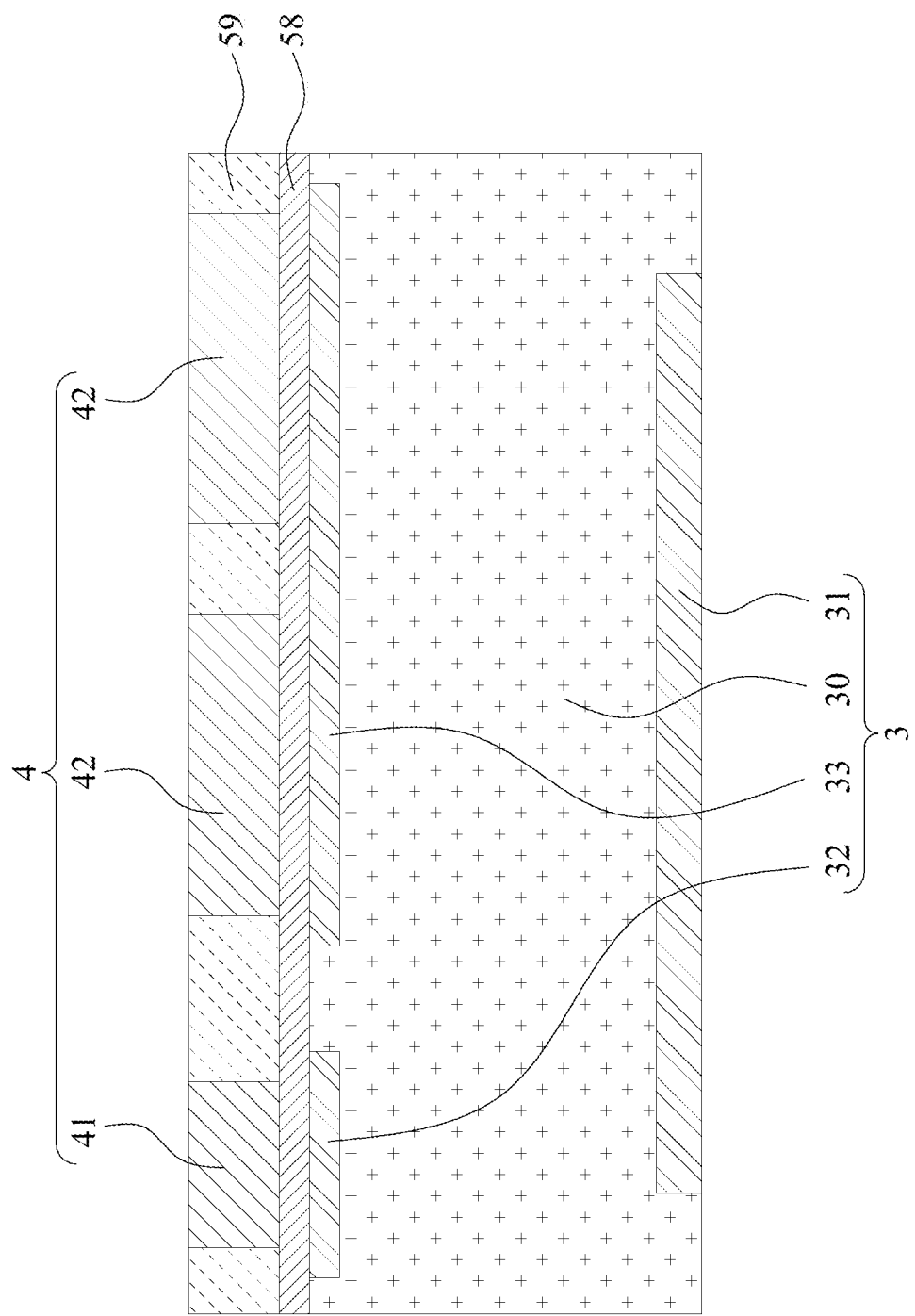
FIG. 24 illustrates one or more stages of an example of a method for manufacturing a semiconductor die according to some embodiments of the present disclosure.

Referring to FIG. 22, a first semiconductor die 3 is provided and a seed layer material 58 is formed on the first semiconductor die 3. The first semiconductor die 3 includes an active region 30, a first electrode 31, a second electrode 32, and third electrode 33. Referring to FIG. 23, a patterned photoresist layer 59 is formed on the seed layer material 58. Referring to FIG. 24, a first plurality of conductive pillars 4 is formed within the space defined by the patterned photoresist layer 59 by, for example, an electroplating process followed by a grinding process. The first plurality of conductive pillars 4 includes a first conductive pillar 41 aligned with the second electrode 32 and a second conductive pillar 42 aligned with the third electrode 33.

Figure 25:
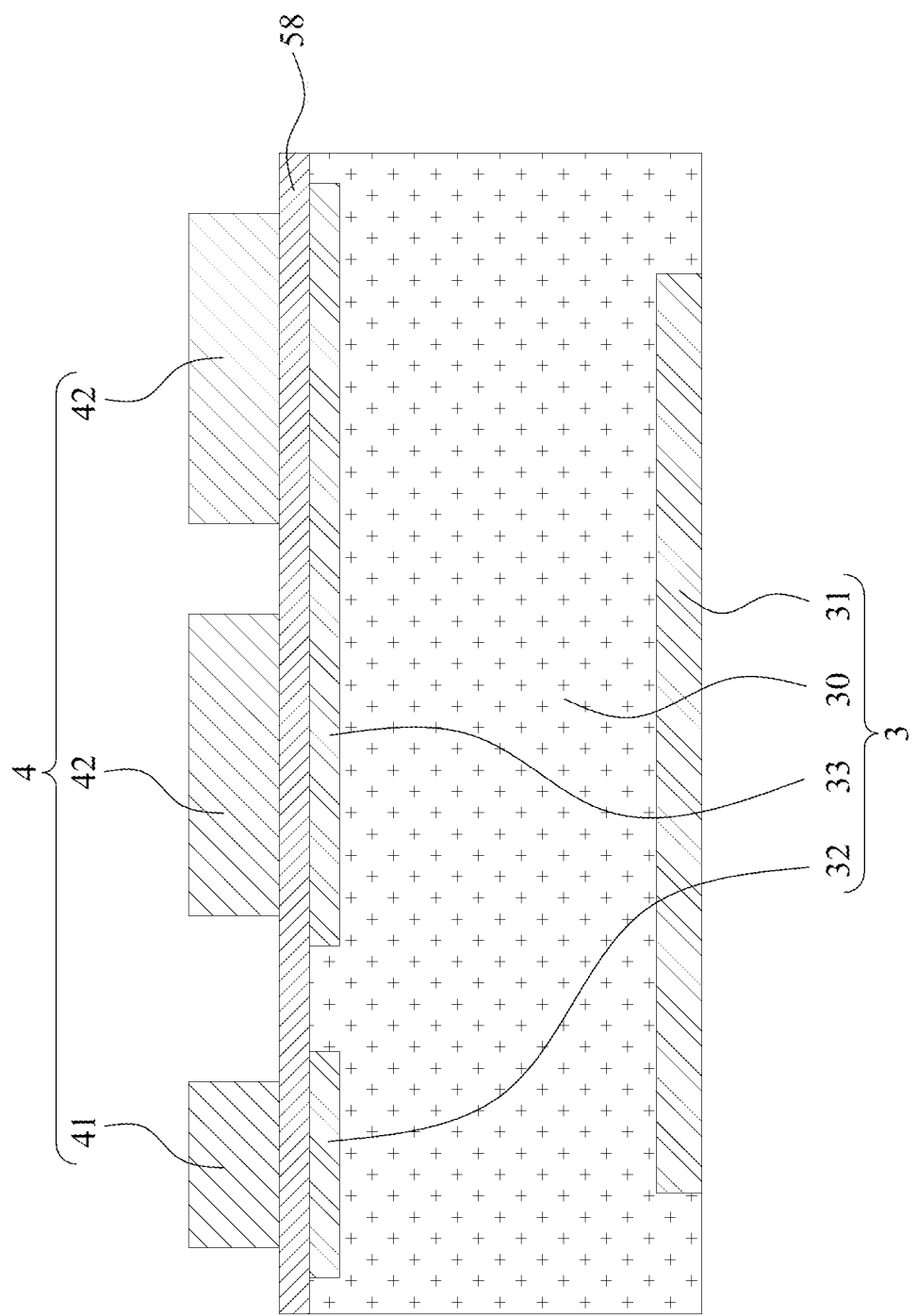
FIG. 25 illustrates one or more stages of an example of a method for manufacturing a semiconductor die according to some embodiments of the present disclosure.
Figure 26:
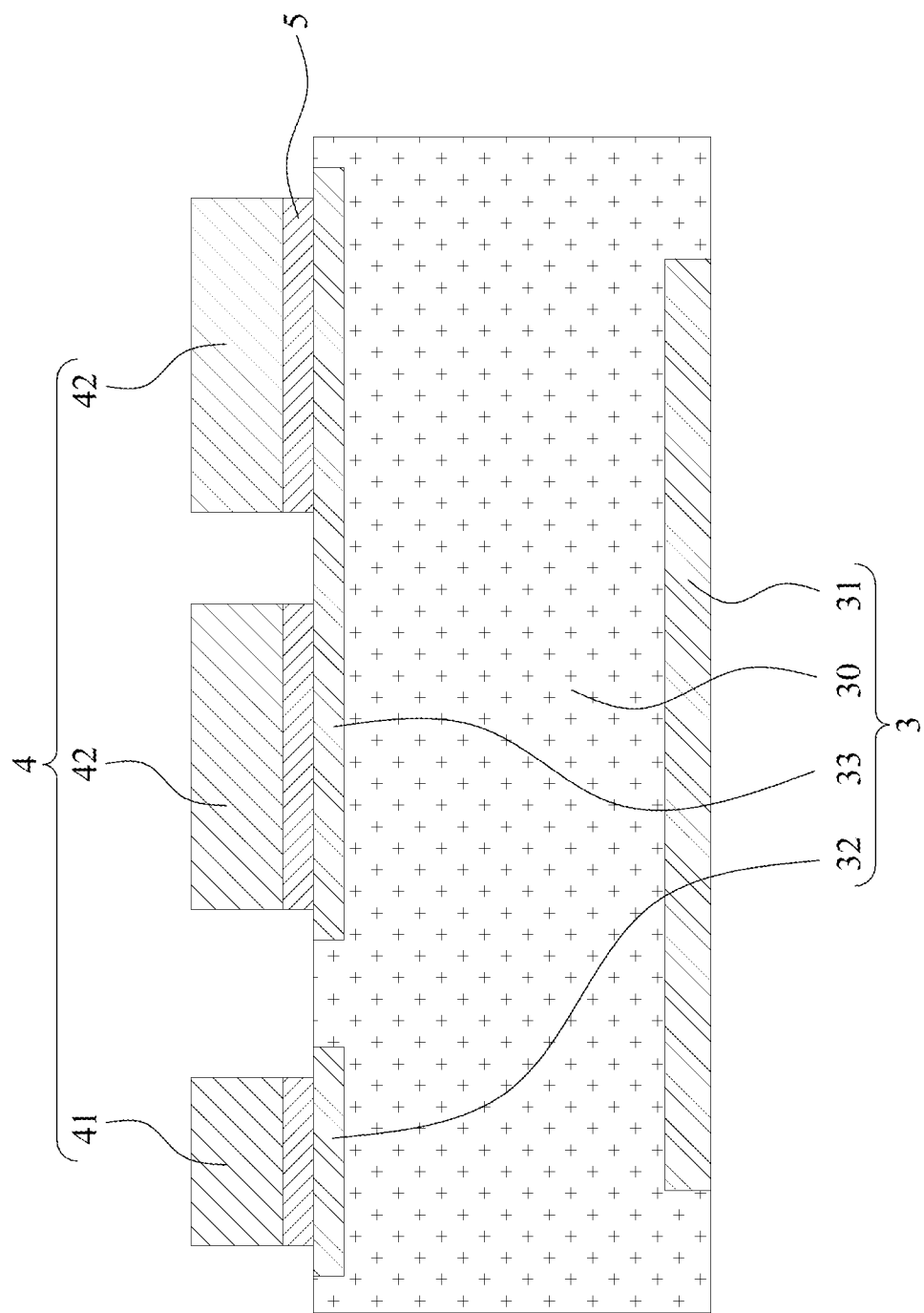
FIG. 26 illustrates one or more stages of an example of a method for manufacturing a semiconductor package structure according to some embodiments of the present disclosure.

Referring to FIG. 25, the patterned photoresist layer 59 is removed by, for example, an etching process and a portion of the seed layer material 58 is then exposed. Referring to FIG. 26, the exposed portion of the seed layer material 58 is removed by, for example, an etching process, to form a seed layer 5.

FIG. 27 through FIG. 34 illustrate a method for manufacturing a semiconductor package structure according to some embodiments of the present disclosure. In some embodiments, the method is for manufacturing the semiconductor package structure 2A shown in FIG. 5.

Figure 27:
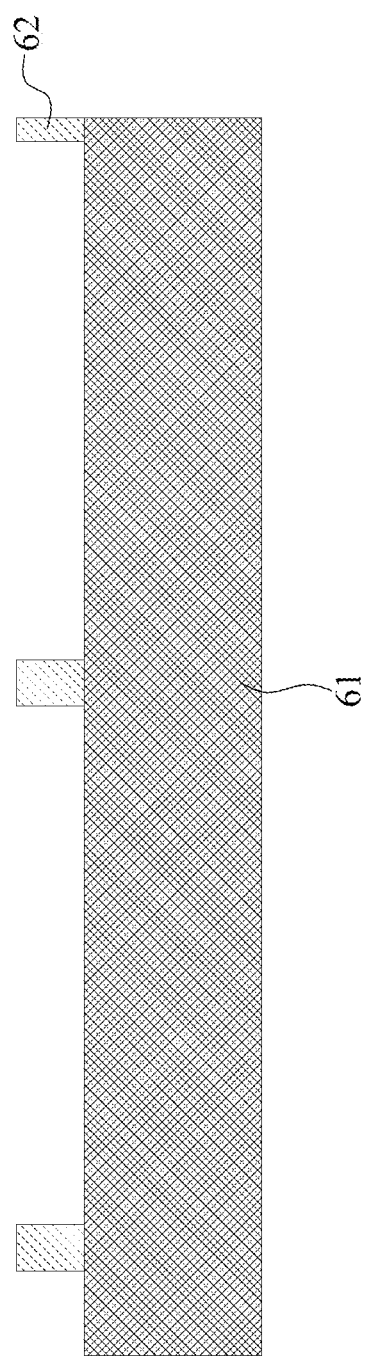
FIG. 27 illustrates one or more stages of an example of a method for manufacturing a semiconductor package structure according to some embodiments of the present disclosure.
Figure 28:
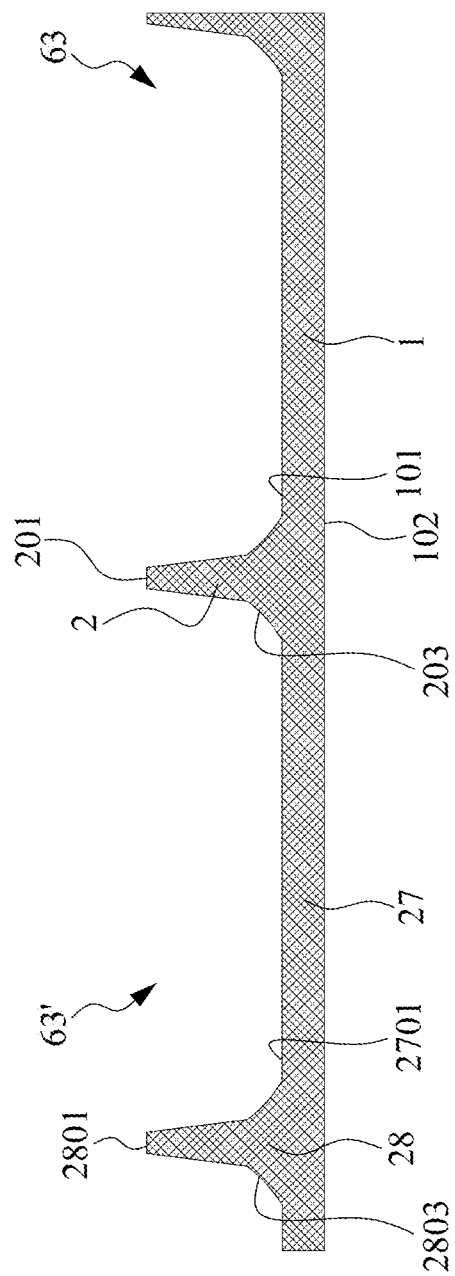
FIG. 28 illustrates one or more stages of an example of a method for manufacturing a semiconductor package structure according to some embodiments of the present disclosure.

Referring to FIG. 27, a conductive base material 61 is provided and a photoresist layer 62 is formed and patterned on the conductive base material 61. Referring to FIG. 28, the conductive base material 61 is half etched to form a conductive base 1 and a conductive base 27. The conductive base 1 has a conductive post 2. A first surface 101 of the conductive base 1 and a lateral surface 203 of the conductive post 2 define a space 63. The conductive base 27 has a conductive post 28. A first surface 2701 of the conductive base 27 and a lateral surface 2803 of the conductive post 28 define a space 63'.

Figure 29:
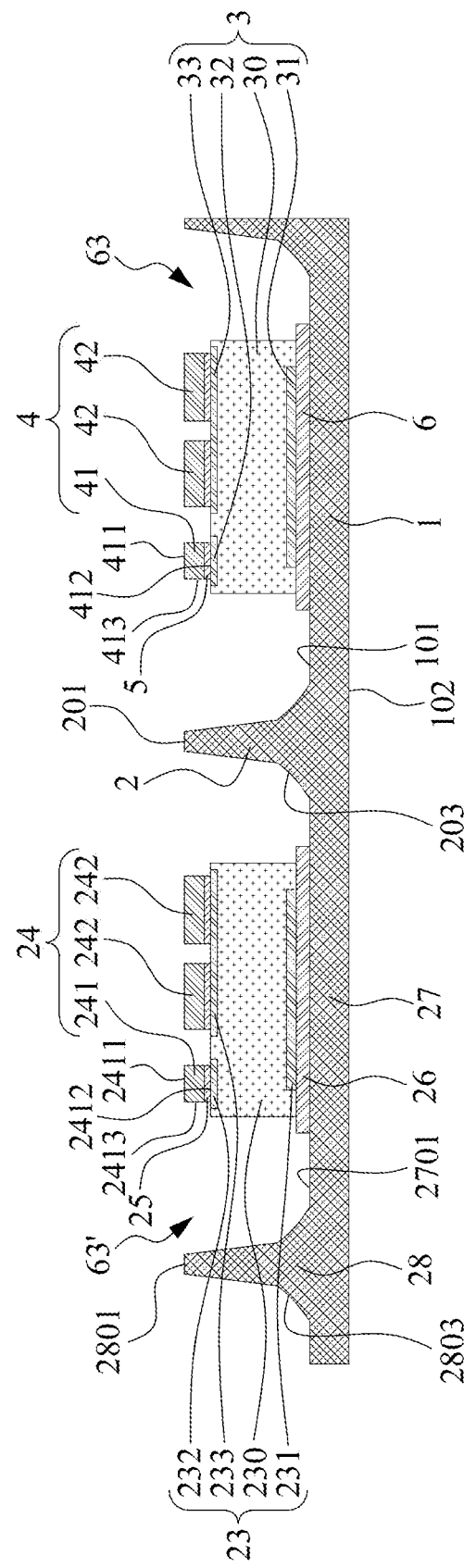
FIG. 29 illustrates one or more stages of an example of a method for manufacturing semiconductor package structure according to some embodiments of the present disclosure.

Referring to FIG. 29, a first semiconductor die 3 is attached to the first surface 101 of the conductive base 1 through an adhesive layer 6. The first semiconductor die 3 is within the space 63. The first semiconductor die 3 includes an active region 30, a first electrode 31, a second electrode 32, and third electrode 33. The first electrode 31 is electrically connected to the conductive base 1 through the adhesive layer 6. The first semiconductor die 3 includes a first plurality of conductive pillar 4. The first plurality of conductive pillar 4 includes a first conductive pillar 41 and a second conductive pillar 42, which are respectively electrically connected to the second electrode 32 and third electrode 33. The first conductive pillar 41 has a first surface 411 (e.g., a top surface), a second surface 412 (e.g., a bottom surface), and a lateral surface 413 extending from the first surface 411 and the second surface 412.

Still referring to FIG. 29, a second semiconductor die 23 is attached to the first surface 2701 of the conductive base 27 through an adhesive layer 26. The second semiconductor die 23 is within the space 63'. The second semiconductor die 23 includes an active region 230, a first electrode 231, a second electrode 232, and third electrode 233. The first electrode 231 is electrically connected to the conductive base 27 through the adhesive layer 6. The second semiconductor die 23 includes a second plurality of conductive pillar 24. The second plurality of conductive pillars 24 includes a first conductive pillar 241 and a second conductive pillar 242, which are respectively electrically connected to the second electrode 232 and third electrode 233. The first conductive pillar 241 has a first surface 2411 (e.g., a top surface), a second surface 2412 (e.g., a bottom surface), and a lateral surface 2413 extending from the first surface 2411 and the second surface 2412.

As shown in FIG. 29, a seed layer 5 is formed between the bottom surface 412 of the first conductive pillar 41 and the first surface 301 of the first semiconductor die 3. A seed layer 25 is formed between the bottom surface 2412 of the first conductive pillar 241 and the first surface 2301 of the second semiconductor die 23. On the other hand, the first conductive pillar 41 is free from a buffer layer or a seed layer along the lateral surface 413. The first conductive pillar 241 is free from a buffer layer or a seed layer along the lateral surface 2413.

Figure 30:
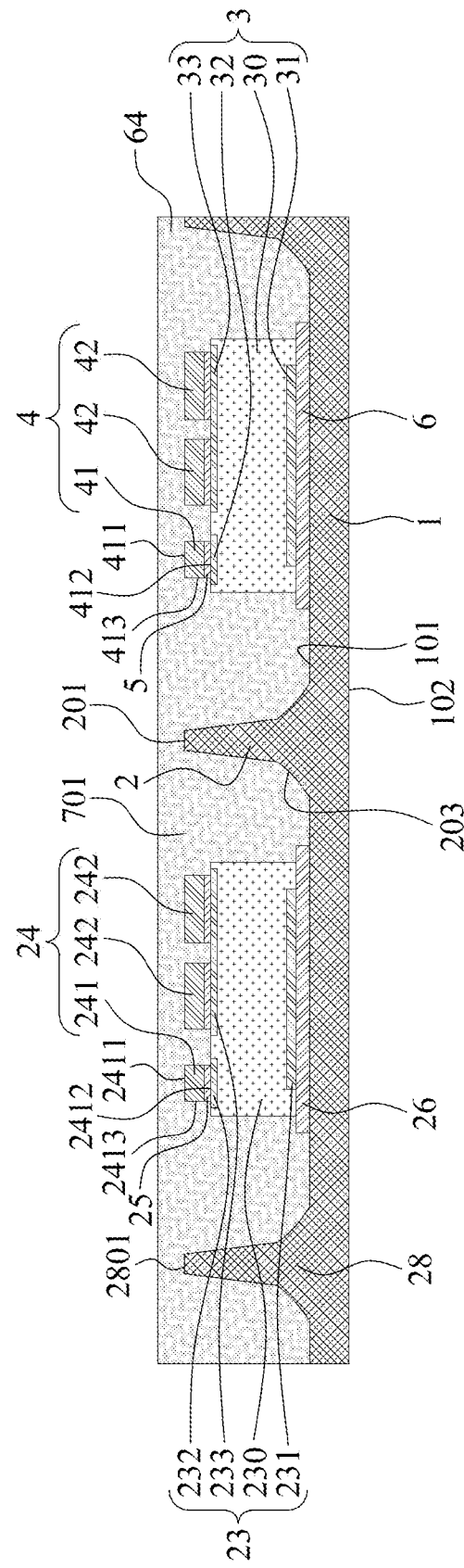
FIG. 30 illustrates one or more stages of an example of a method for manufacturing a semiconductor package structure according to some embodiments of the present disclosure.

Referring to FIG. 30, an encapsulating material 64 is formed on the conductive base 1 and the conductive base 27 to encapsulate the conductive post 2, the first semiconductor die 3, the conductive post 28, and the second semiconductor die 23.

Figure 31:
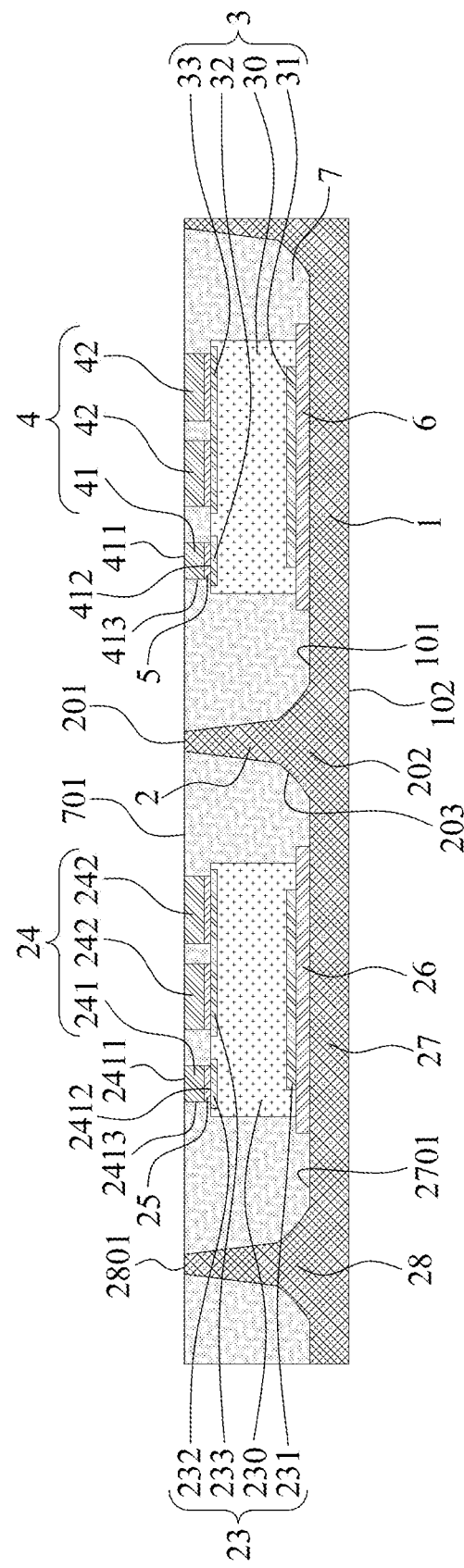
FIG. 31 illustrates one or more stages of an example of a method for manufacturing a semiconductor package structure according to some embodiments of the present disclosure.

Referring to FIG. 31, the encapsulating material 64 is grinded to form a first encapsulant 7 having a first surface 701 (e.g., a top surface) away from the conductive base 1. The first surface 701 of the first encapsulant 7, the top surface 201 of the conductive post 2, and/or the first surface 411 of the first conductive pillar 41 are substantially coplanar. The first surface 701 of the first encapsulant 7, the top surface 2801 of the conductive post 28, and/or the first surface 2411 of the first conductive pillar 241 are substantially coplanar.

Still referring to FIG. 31, the first of plurality conductive pillars 4 and the second of plurality conductive pillars 24 are implemented before the first encapsulant 7 is formed, resulting that the first encapsulant 7 may include one or more openings defined by the first plurality of conductive pillars 4 and the second of plurality conductive pillars 24. For example, the first encapsulant 7 includes a first opening 71 defined by the first pillar 41 and a second opening 271 defined by the first pillar 241. The roughness of a side surface of the first opening 71 is defined by the lateral surface 413 of the first conductive pillar 41. The roughness of a side surface of the second opening 271 is defined by the lateral surface 2413 of the first conductive pillar 241. As shown in FIG. 31, the first conductive pillar 41 is free from possessing a lateral extension portion between the top surface 411 and the bottom surface 412 and the first conductive pillar 241 is free from possessing a lateral extension portion between the top surface 2411 and the bottom surface 2412. The first conductive pillar 41 or the second conductive pillar 42 may have a uniform width. The first conductive pillar 241 or the second conductive pillar 242 may have a uniform width.

Figure 32:
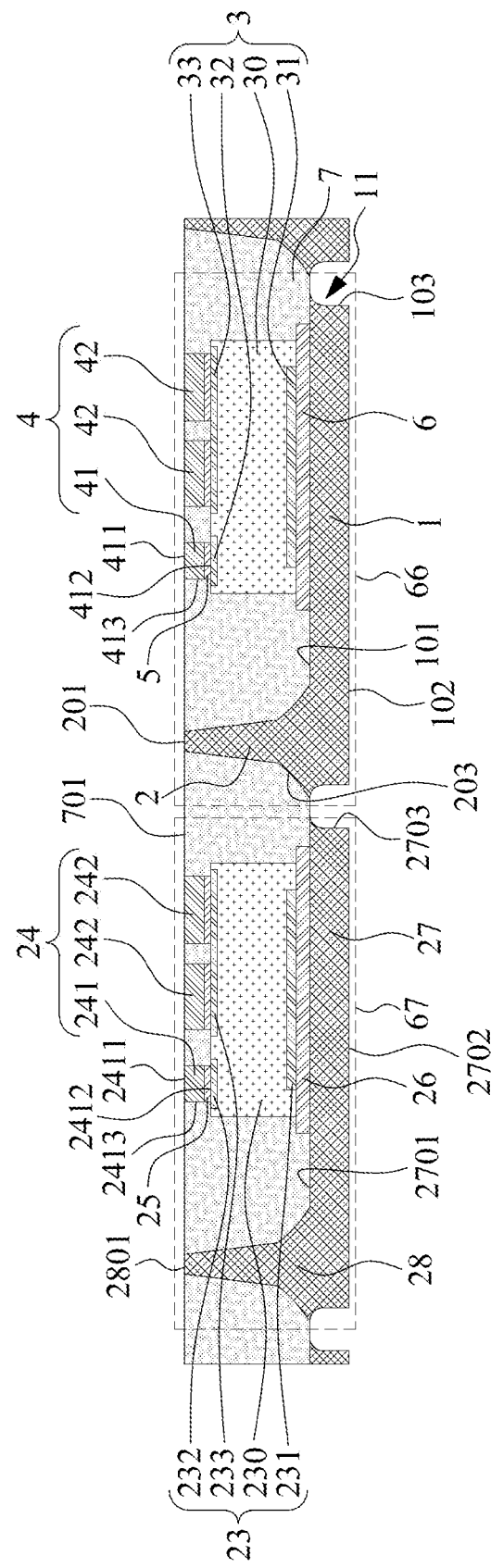
FIG. 32 illustrates one or more stages of an example of a method for manufacturing a semiconductor package structure according to some embodiments of the present disclosure.

Referring to FIG. 32, the conductive base 1 and the conductive base 27 may collectively be referred as a connected conductive base. The connected conductive base is etched from the bottom surface, i.e., a second surface 102 and a second surface 2702, to form a first discrete unit 67 and a second discrete unit 68. The first discrete unit 67 may include the conductive base 1, the conductive post 2, and the first semiconductor die 3 including the first plurality of conductive pillars 4. The second discrete unit 68 may include the conductive base 27, the conductive post 28, and the second semiconductor die 23 including the second plurality of conductive pillars 24. As shown in FIG. 32, the conductive base 1 is etched from the second surface 102 to form a curved surface 103. The curved surface 103 defines a region 11. The curved surface 103 may extend from the first surface 101 to the second surface 102. The conductive base 27 is etched from the second surface 2702 to form a curved surface 2703.

Figure 33:
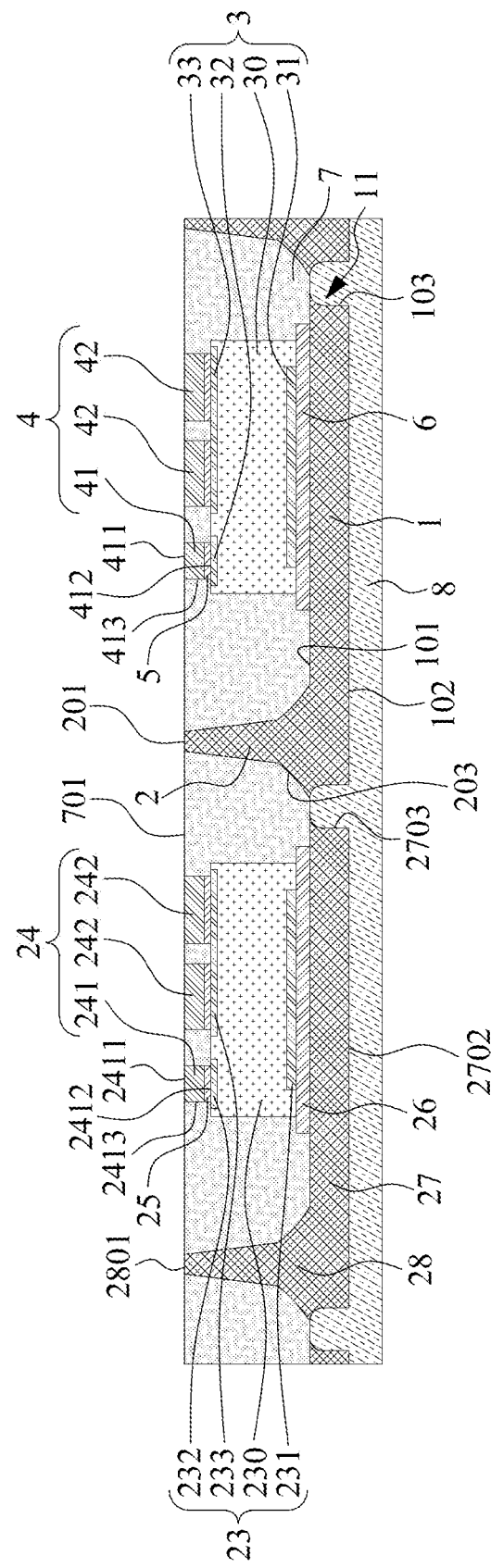
FIG. 33 illustrates one or more stages of an example of a method for manufacturing a semiconductor package structure according to some embodiments of the present disclosure.

Referring to FIG. 33, a second encapsulant 8 is formed on the second surface 102 and the second surface 2702 by, for example, a molding process. A portion of the second encapsulant 8 is in contact with the curved surface 103 or the curved surface 2703. In some embodiments, the second encapsulant 8 may entirely cover the second surface 102 to prevent from exposing the conductive base 1. The second encapsulant 8 may entirely cover the second surface 2702 to prevent from exposing the conductive base 27.

Figure 34:
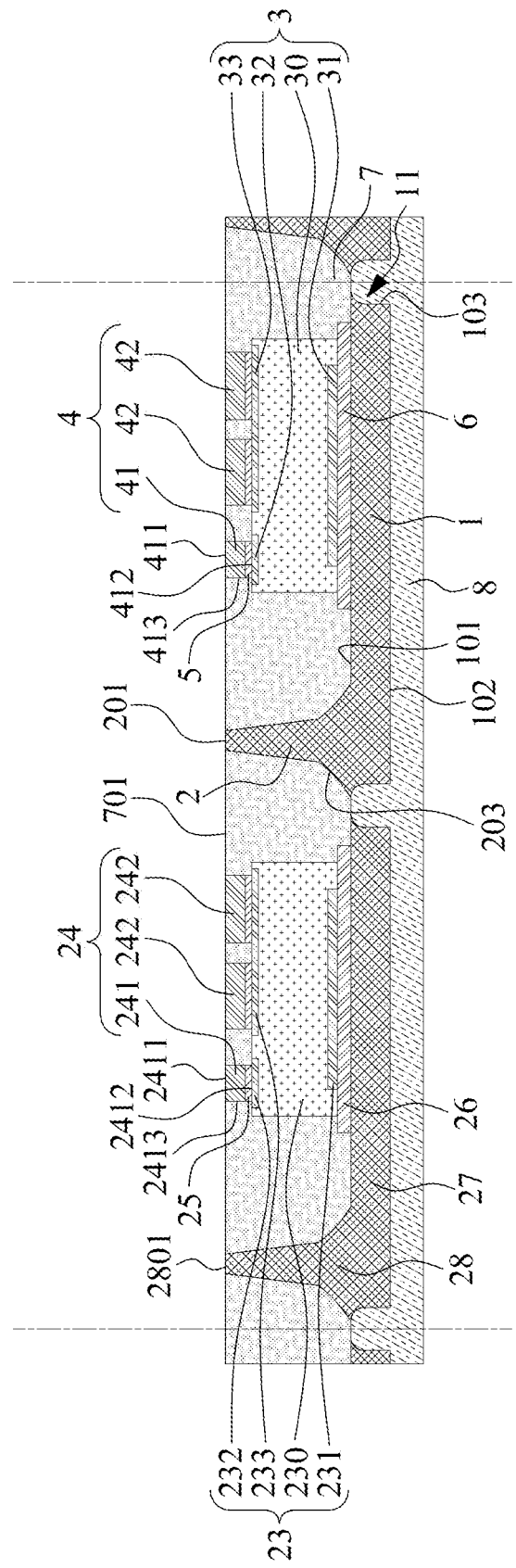
FIG. 34 illustrates one or more stages of an example of a method for manufacturing a semiconductor package structure according to some embodiments of the present disclosure.

Referring to FIG. 34, a singulation process is performed to form the semiconductor package structure 2A shown in FIG. 5. In some embodiments, the semiconductor package structure 2A may be attached to a substrate before or after the singulation process as illustrated in FIG. 34.

Figure 35:
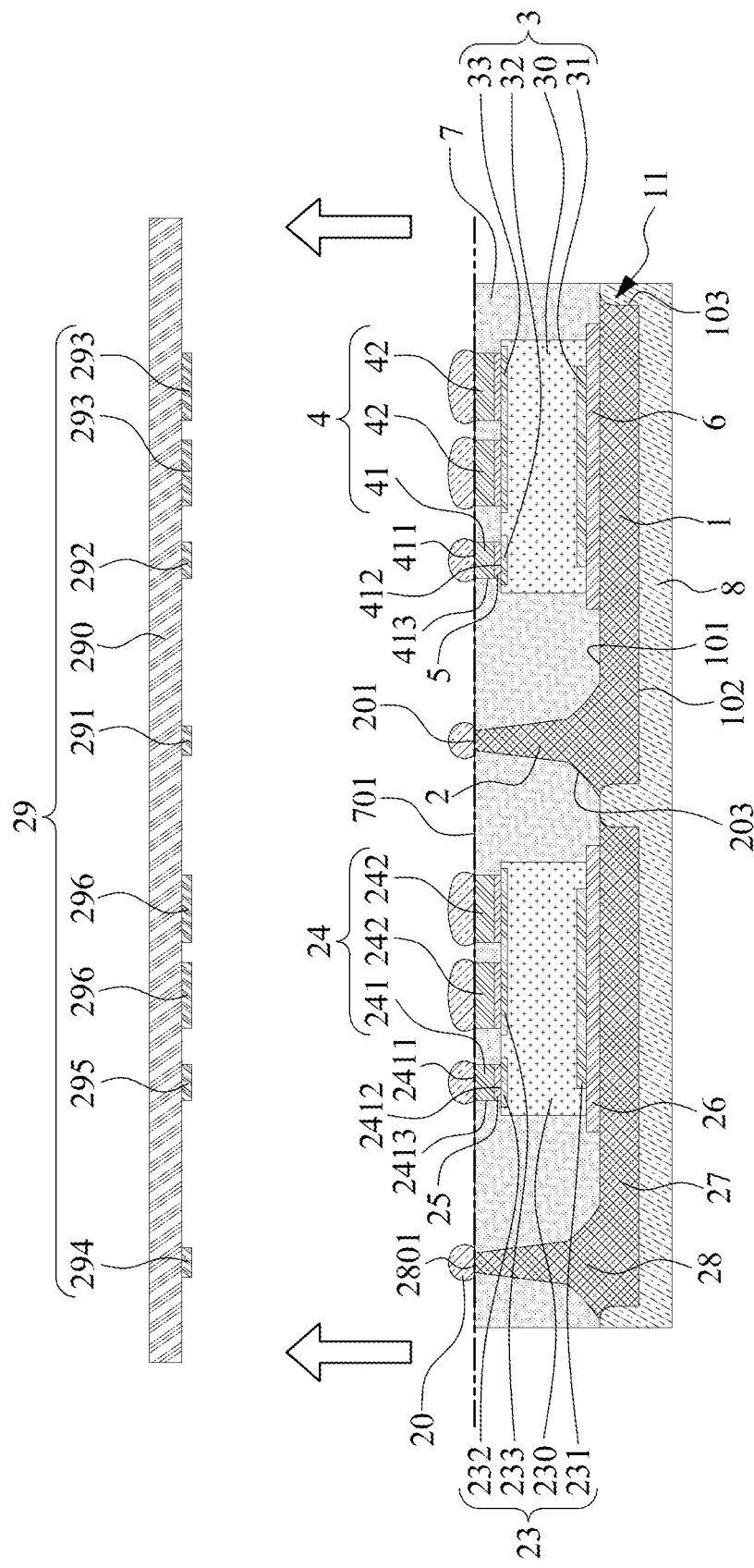
FIG. 35 illustrates one or more stages of an example of a method for manufacturing a semiconductor package structure according to some embodiments of the present disclosure.

FIG. 35 illustrates a method for manufacturing a semiconductor package structure according to some embodiments of the present disclosure. In some embodiments, the method is for manufacturing the semiconductor package structure 2B shown in FIG. 6. The initial stages of the illustrated process are the same as, or similar to, the stages illustrated in FIG. 27 to FIG. 34. FIG. 35 depicts a stage subsequent to that depicted in FIG. 34.

Referring to FIG. 35, the semiconductor package structure is attached to a substrate 29 through a plurality of connection elements 20. The substrate 29 includes a conductive layer 290, and a first electrode 291, a second electrode 292, a third electrode 293, a fourth electrode 294, a fifth electrode 295, and a sixth electrode 296 each electrically connected to the conductive layer 290. The first electrode 91, the second electrode 92, the third electrode 93, the fourth electrode 294, the fifth electrode 295, and the sixth electrode 296 respectively electrically connected to the conductive post 2, the first pillar 41, the second pillar 42, the conductive post 28, the first pillar 241, and the second pillar 242 through one of a plurality of connection element 20. The conductive post 2 and the second electrode 242 may be electrically connected through the substrate 29, such that the first semiconductor die 3 and the second semiconductor die 23 are electrically connected.

Figure 36:
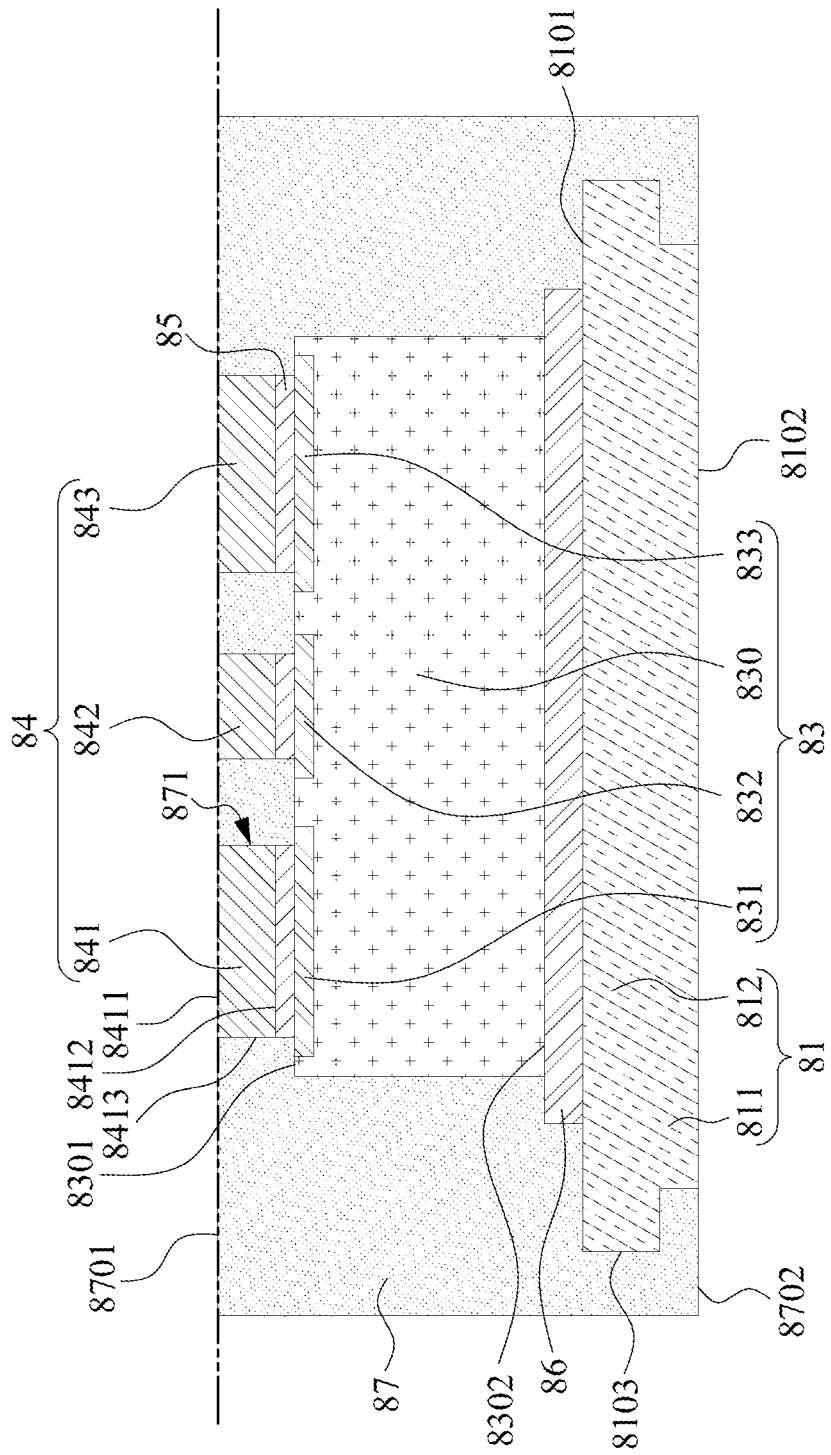
FIG. 36 illustrates a cross-sectional view of a semiconductor package structure according to some embodiments of the present disclosure.

FIG. 36 illustrates a cross-sectional view of a semiconductor package structure 3A according to some embodiments of the present disclosure. The semiconductor package structure 3A includes a conductive base 81, a first semiconductor die 83, a plurality of first conductive pillars 84, a seed layer 85, an adhesive layer 86, and a first encapsulant 87. The first semiconductor die 83 of the semiconductor package structure 3A is configured to conduct electrical current in a horizontal direction therefore all the electrodes are formed on a first surface 8301 of the first semiconductor die 83.

The conductive base 81 has a first surface 8101, a second surface 8102 opposite to the first surface 8101, and a lateral surface 8103. The conductive base 81 includes a first portion 811 and a second portion 812. The first portion 811 has a width smaller than that of the second portion 812. The conductive base 81 may include metal or metal alloy such as copper (Cu), gold (Au), aluminum (Al), or in alloy thereof. The conductive base 8 may include a mold lock feature to fasten the first semiconductor die 83 and thus prevent from the delamination between the first semiconductor die 83 and the conductive base 81.

The first semiconductor die 83 is disposed on the conductive base 81. The adhesive layer 86 is disposed between the first semiconductor die 83 and the conductive base 81. The adhesive layer 86 may include a thermal conductive material, such that the thermal dissipation from the first semiconductor die 83 to the conductive base 81 can be improved. The first semiconductor die 83 has a first surface 8301 away from the conductive base 81 and a second surface 8302 toward the conductive base 81. The first plurality of conductive pillars 84 is disposed on the first semiconductor die 83. The first plurality of conductive pillars 84 includes a first conductive pillar 841, a second conductive pillar 842, and a third conductive pillar 843. The first conductive pillar 841 has a first surface 8411 (e.g., a top surface), a second surface 8412 (e.g., a bottom surface), and a lateral surface 8413 extending from the first surface 8411 and the second surface 8412. The first plurality of conductive pillars 84 (e.g., the first conductive pillar 841 and the second conductive pillar 842) is surrounded by and in contact with the first encapsulant 87. In some embodiments, the lateral surface 8413 is in contact with the first encapsulant 87. The first encapsulant 87 has a first surface 8701 (e.g., a top surface) away from the conductive base 1. The first surface 8701 of the first encapsulant 87 and the first surface 8411 of the first conductive pillar 841 are substantially coplanar.

The first plurality of conductive pillars 84 may each include metal such as copper (Cu), gold (Au), aluminum (Al), or the like. The first encapsulant 87 may be composed of epoxy and a plurality of fillers. The first encapsulant 87 may include epoxy resin or other suitable mold material.

Still referring to FIG. 36, the seed layer 85 is disposed between each of the first plurality of conductive pillars 84 and the first semiconductor die 83. Furthermore, the lateral surface 8413 of the first conductive pillar 841 is not covered by a buffer layer or a seed layer. In other word, the lateral surface 8413 is directly in contact with the first encapsulant 87. The second conductive pillar 842 and the third conductive pillar 843 are similar to the first conductive pillar 841 in terms of the characteristics and the relationship with the first encapsulant 87.

In the present disclosure, the first of plurality conductive pillars 84 is implemented before the first encapsulant 87 is formed, resulting that the first encapsulant 87 may include one or more openings defined by the first plurality of conductive pillars 84. For example, the first encapsulant 87 includes an opening 871 defined by the first pillar 841. The roughness of a side surface of the opening 871 is defined by the lateral surface 8413 of the first conductive pillar 841. As shown in FIG. 1, the first conductive pillar 841 is free from possessing a lateral extension portion between the top surface 8411 and the bottom surface 8412. The first conductive pillar 841 may have a uniform width.

Again referring to FIG. 36, the first semiconductor die 83 includes an active region 830, a first electrode 831 disposed adjacent to the second surface 8302, and a second electrode 832 and a third electrode 833 each disposed adjacent to the first surface 8301. The active region 830 is electrically connected to the first electrode 831, the second electrode 832 or the third electrode 833. In some embodiment, the active region 830 may include a transistor. The transistor may be a power transistor. The active region 830 may include a gallium nitride (GaN) transistor. The first electrode 831, the second electrode 832, the third electrode 833 may be electrically connected to a drain terminal, a gate terminal, a source terminal of the transistor, respectively. The first conductive pillar 841, the second conductive pillar 842, and the third conductive pillar 843 are electrically connected to the first electrode 831, the second electrode 832, and the third electrode 833 of the first semiconductor die 83, respectively. The first semiconductor die 83 is configured to electrically connect to an external substrate, such as printed circuit board (PCB) through the first plurality of conductive pillars 84. The first conductive pillar 841, the second conductive pillar 842, the third conductive pillar 843 may directly transmit the electrical signal from the first semiconductor die 83 to the external substrate without passing through other circuitry in the semiconductor package structure 3A.

In some comparative embodiments, a through-via structure or a RDL structure is disposed between a semiconductor chip and a substrate for an electrical connection thereof. However, the through via structure generally formed through the laser drilling process causes high process costs. On the other hand, the formation of the RDL structure includes a costly pre-preg lamination process. In the present disclosure, the first plurality of conductive pillars 84 which is formed before being encapsulated by the first encapsulant 87 provides a robust electrical transmission path for the semiconductor die 83 and an external substrate. The cost can be relatively low as compared to the through-via structure or the RDL structure. Moreover, the first encapsulant 87 is formed in a molding process which is faster and cheaper than the prepreg lamination used in the RDL structure process.

Figure 37:
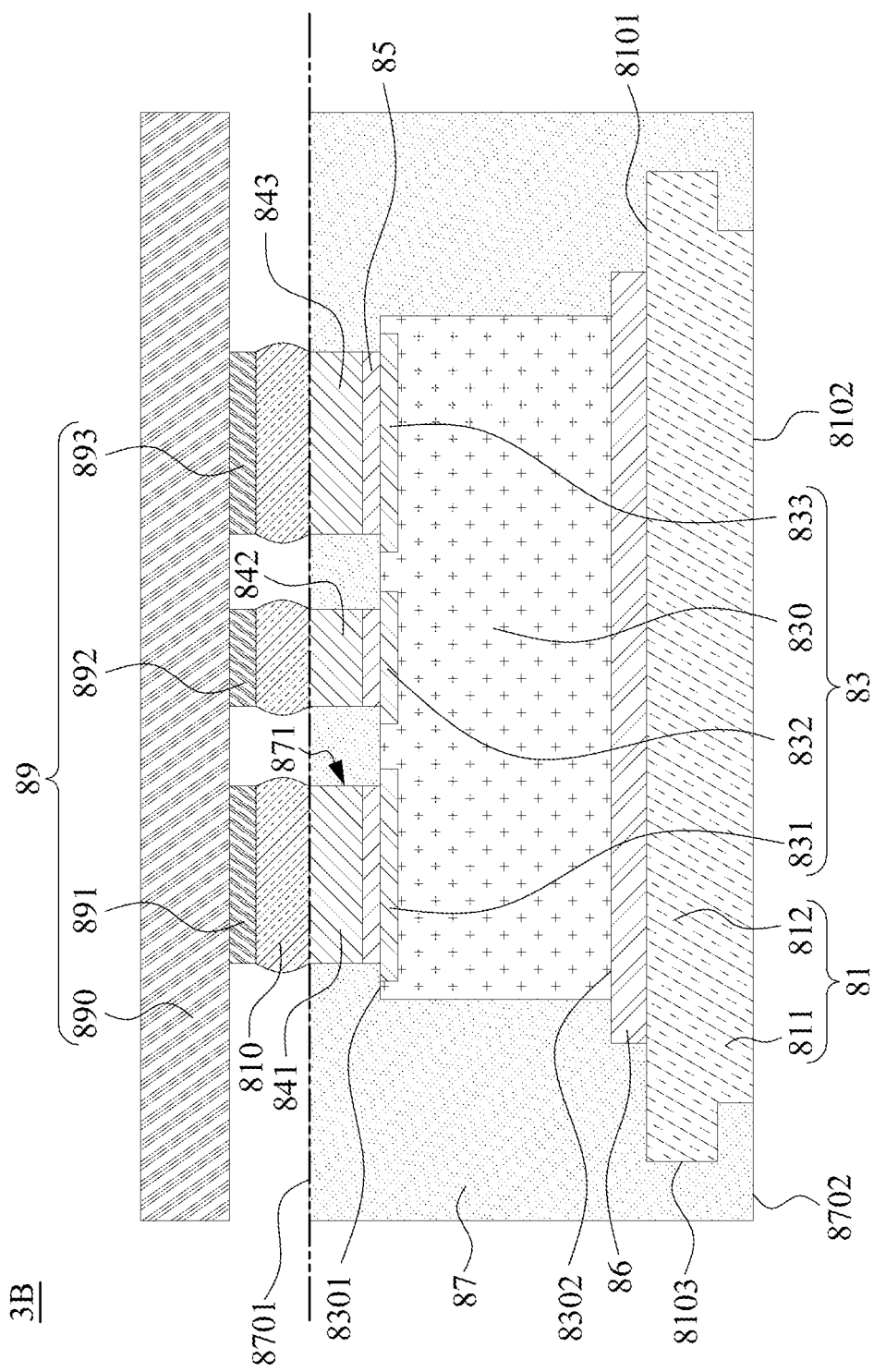
FIG. 37 illustrates a cross-sectional view of a semiconductor package structure according to some embodiments of the present disclosure.

FIG. 37 illustrates a cross-sectional view of a semiconductor package structure 3B according to some embodiments of the present disclosure. The semiconductor package structure 3B is similar to the semiconductor package structure 3A in FIG. 36, except that the semiconductor package structure 3B further includes a substrate 89 disposed on the first semiconductor die 83. The substrate 89 includes a conductive layer 890, and a first electrode 891, a second electrode 892, and a third electrode 893 each electrically connected to the conductive layer 890. The first electrode 891, the second electrode 892, and the third electrode 893 respectively electrically connected to the first conductive pillar 841, the second conductive pillar 842, and the third conductive pillar 843 through one of a plurality of connection element 810. The substrate 89 may include, for example, a PCB, such as a paper-based copper foil laminate, a composite copper foil laminate, or a polymer-impregnated glass-fiber-based copper foil laminate.

Figure 38:
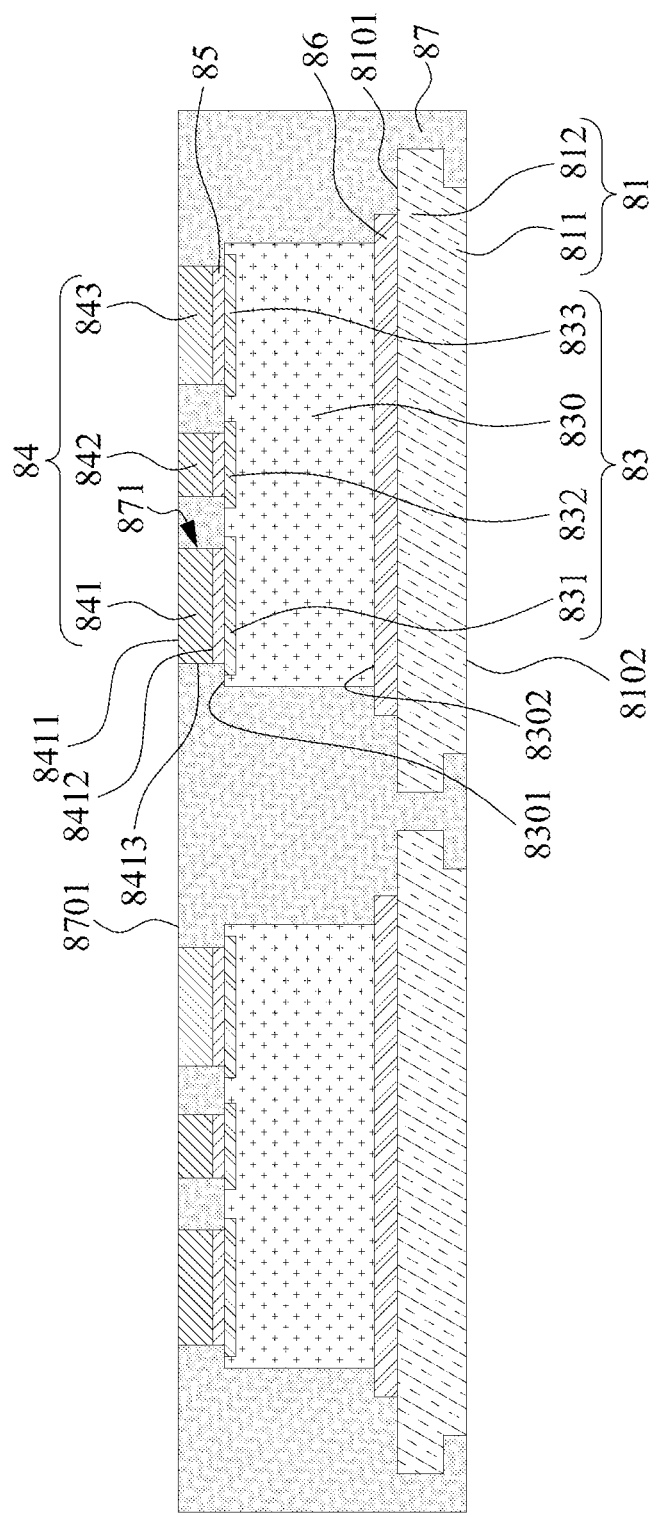
FIG. 38 illustrates a cross-sectional view of a semiconductor package structure according to some embodiments of the present disclosure.

FIG. 38 illustrates a cross-sectional view of a semiconductor package structure 3C according to some embodiments of the present disclosure. The semiconductor package structure 3C is similar to the semiconductor package structure 3A in FIG. 36, except that the semiconductor package structure 3C includes multiple semiconductor dies within the first encapsulant 87. The multiple semiconductor dies are configured to electrically connect to each other in series or in parallel through an external substrate. Prior to connect to the external substrate, the multiple semiconductor dies are electrically isolated to each other, such that no known good semiconductor die is risked in the package assembly steps.

Figure 39:
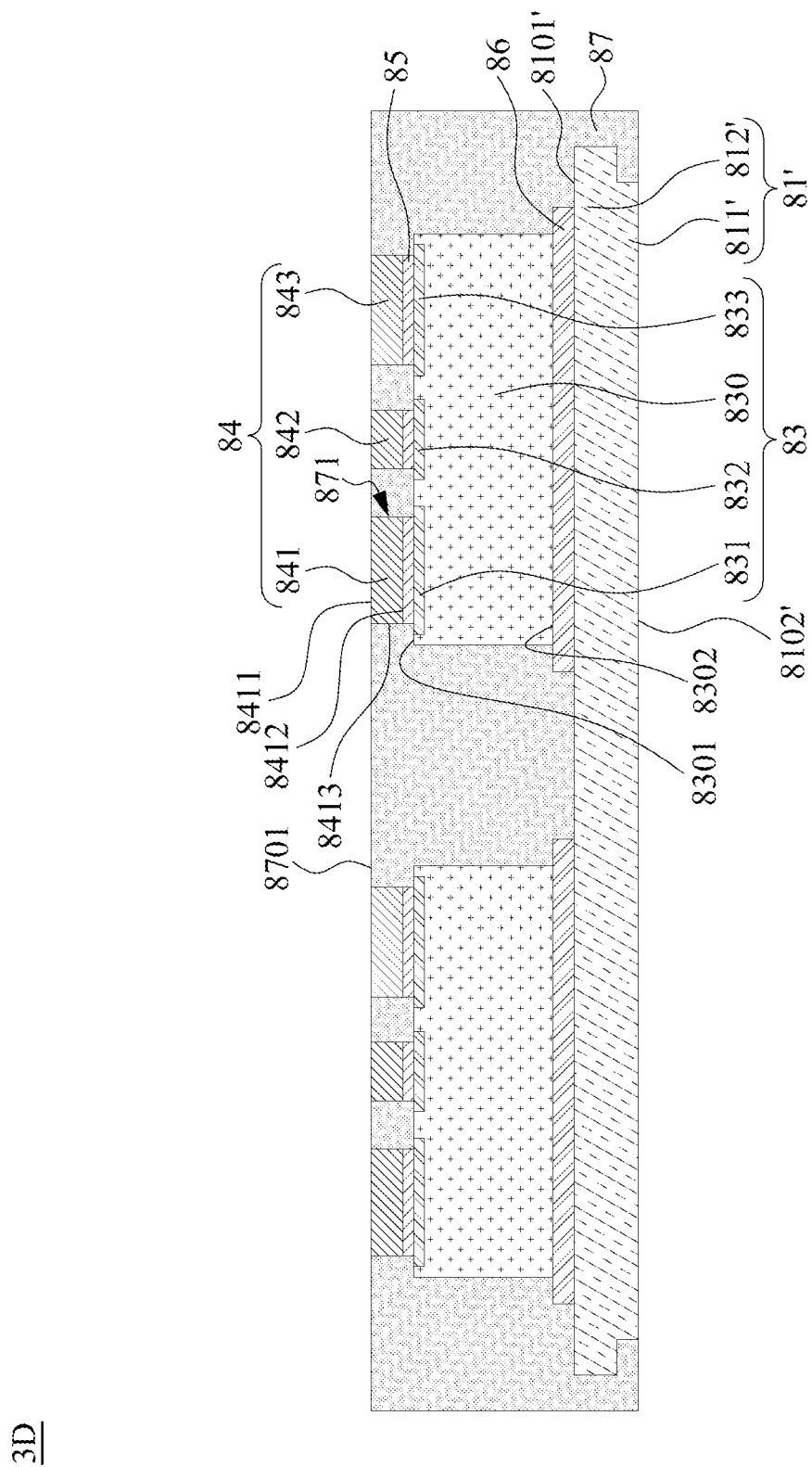
FIG. 39 illustrates a cross-sectional view of a semiconductor package structure according to some embodiments of the present disclosure.

FIG. 39 illustrates a cross-sectional view of a semiconductor package structure 3D according to some embodiments of the present disclosure. The semiconductor package structure 3D is similar to the semiconductor package structure 3C in FIG. 38, except that the multiple semiconductor dies are disposed on a single conductive base 8'. The single conductive base 81' may include a mold lock feature to fasten the semiconductor dies and thus prevent from delamination of the semiconductor dies. The conductive base 81' includes a first portion 811' and a second portion 812'. The first portion 811' has a width smaller than that of the second portion 812'.

FIG. 40 through FIG. 43 illustrate one or more stages of an example of a method for manufacturing a semiconductor package structure according to some embodiments of the present disclosure. In some embodiments, the method is for manufacturing the semiconductor package structure 3A shown in FIG. 36.

Figure 40:
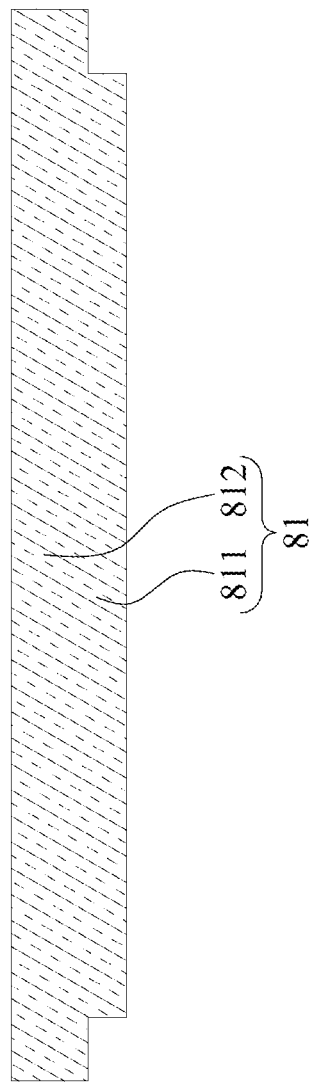
FIG. 40 illustrates one or more stages of an example of a method for manufacturing a semiconductor package structure according to some embodiments of the present disclosure.

Referring to FIG. 40, a conductive base 8 is provided. The conductive base 8 including a first portion 811 and a second portion 812. The second portion 812 has a width greater than that of the first portion 811.

Figure 41:
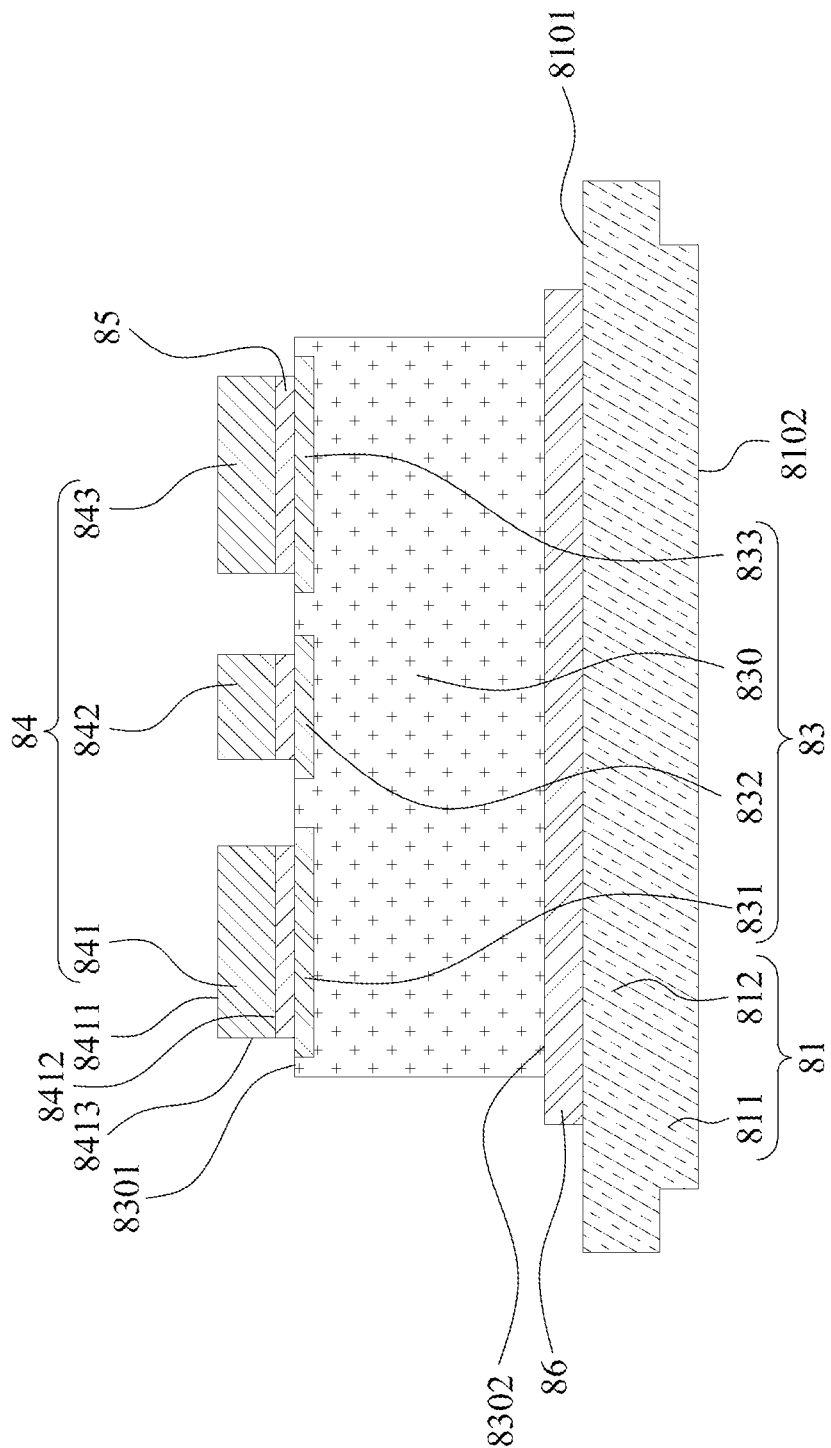
FIG. 41 illustrates one or more stages of an example of a method for manufacturing a semiconductor package structure according to some embodiments of the present disclosure.

Referring to FIG. 41, a first semiconductor die 83 is attached to a first surface 8101 of the conductive base 81 through an adhesive layer 86. The first semiconductor die 83 has a first surface 8301 and a second surface 8302. The first semiconductor die 83 includes an active region 830, a first electrode 831, a second electrode 832, and third electrode 833 adjacent to the first surface 8301. The first semiconductor die 83 includes a first plurality of conductive pillar 84. The first plurality of conductive pillar 84 includes a first conductive pillar 841, a second conductive pillar 842, and a third conductive pillar 843, which are respectively electrically connected to the first electrode, the second electrode 832, and third electrode 33. The first conductive pillar 841, the second conductive pillar 842, or the third conductive pillar 843 may have a uniform width. The first conductive pillar 841 has a first surface 8411 (e.g., a top surface), a second surface 8412 (e.g., a bottom surface), and a lateral surface 8413 extending from the first surface 8411 and the second surface 8412.

Still referring to FIG. 41, a seed layer 85 is formed between each of the first plurality of conductive pillars 84 and the first semiconductor die 83. For example, the seed layer 85 is formed between the bottom surface 8412 of the first conductive pillar 841 and the first surface 8301 of the semiconductor die 83. On the other hand, the first conductive pillar 841 is free from a buffer layer or a seed layer along the lateral surface 8413.

Figure 42:
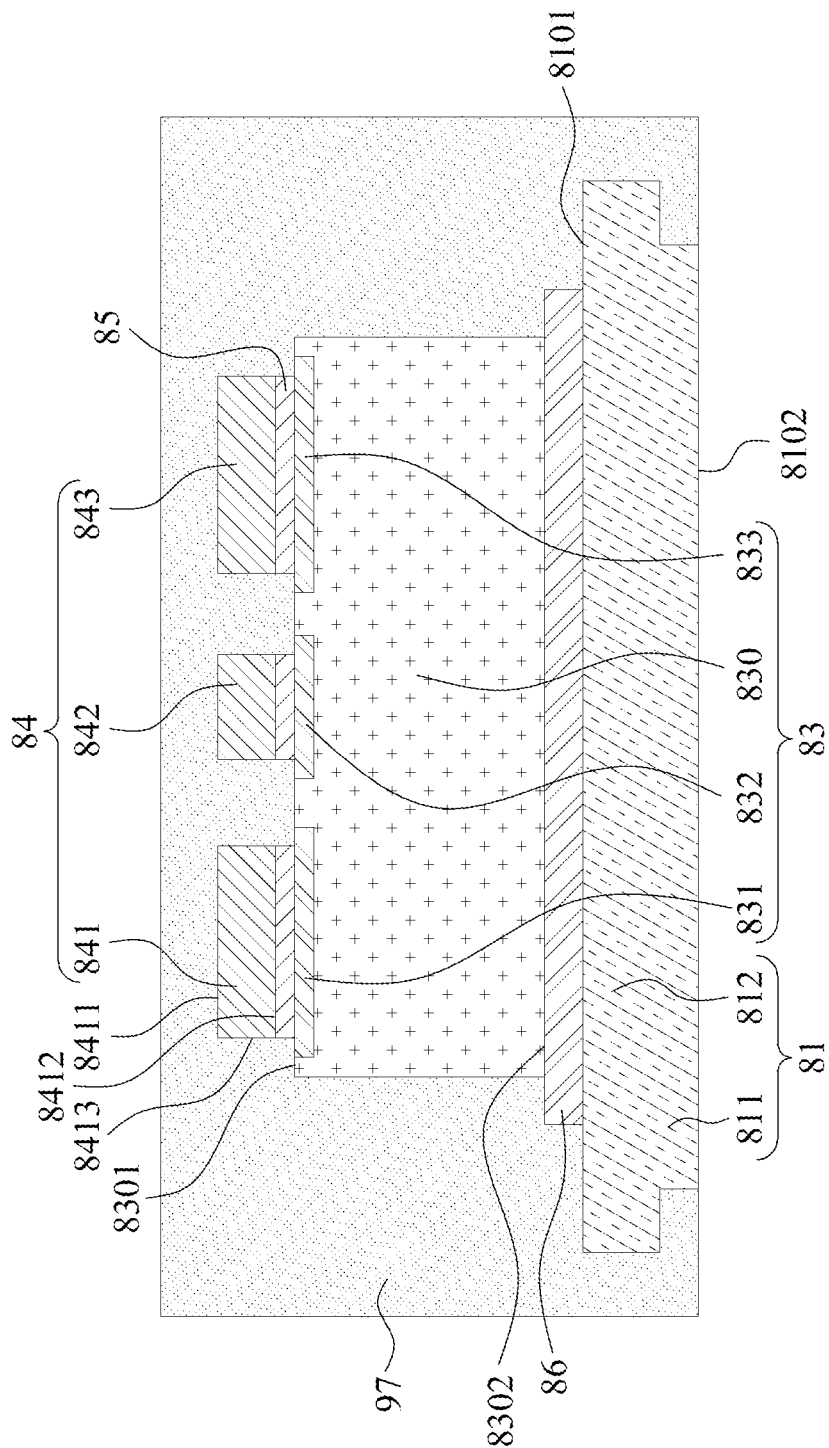
FIG. 42 illustrates one or more stages of an example of a method for manufacturing a semiconductor package structure according to some embodiments of the present disclosure.

Referring to FIG. 42, an encapsulating material 97 is formed on the conductive base 81 to encapsulate the first semiconductor die 83, and each of the first plurality of conductive pillars 84.

Figure 43:
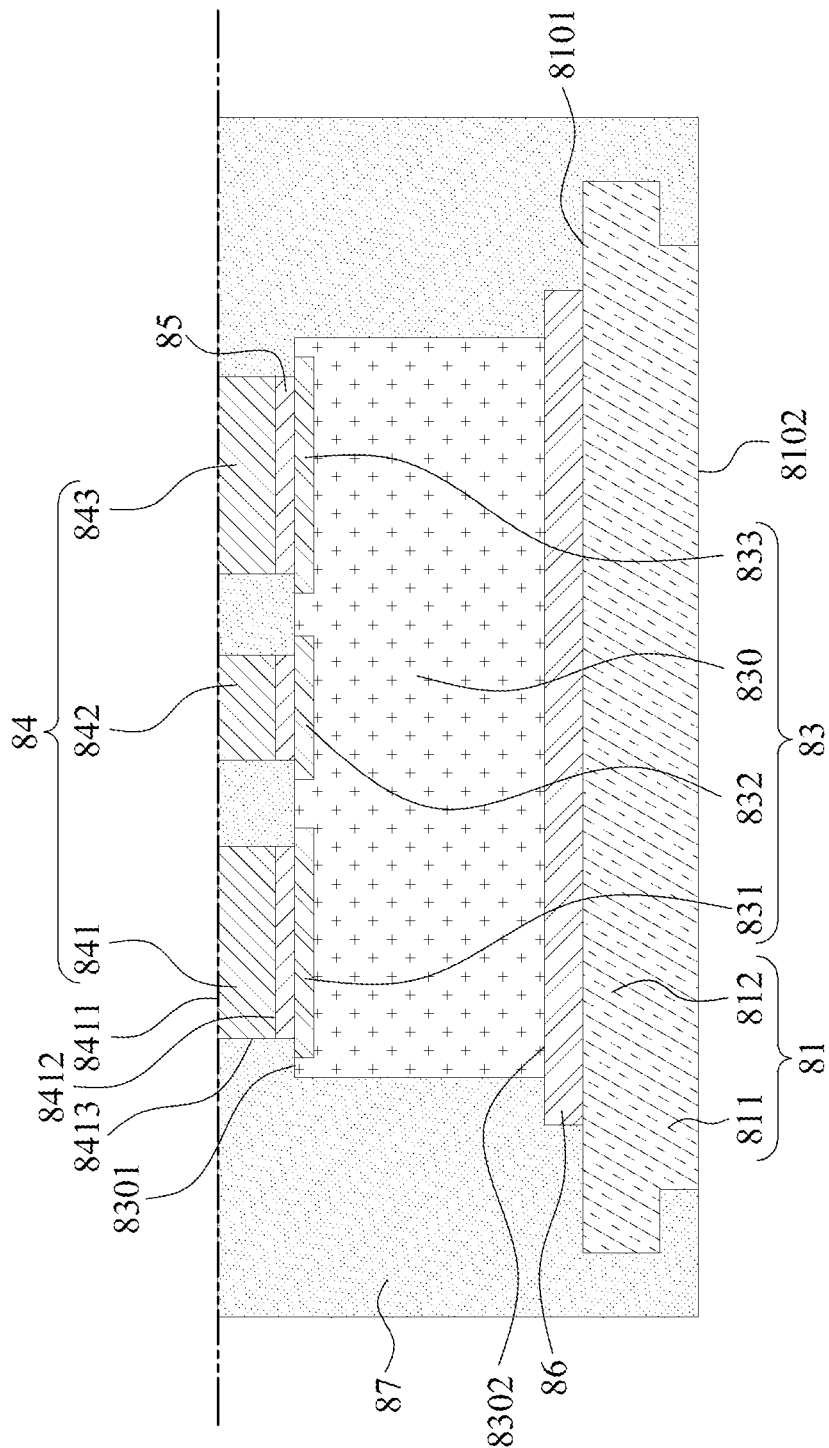
FIG. 43 illustrates one or more stages of an example of a method for manufacturing a semiconductor package structure according to some embodiments of the present disclosure.

Referring to FIG. 43, the encapsulating material 97 is grinded to form a first encapsulant 87 having a first surface 8701 (e.g., a top surface) away from the conductive base 81. The first surface 8701 of the first encapsulant 87 and the first surface 8411 of the first conductive pillar 841 are substantially coplanar. In some embodiment, the first surface 8411 of the first conductive pillar 841 may be protruded from the first surface 8701 of the first encapsulant 87.

Still referring to FIG. 43, the first of plurality conductive pillars 84 is implemented before the first encapsulant 87 is formed, resulting that the first encapsulant 87 may include one or more openings defined by the first plurality of conductive pillars 84. For example, the first encapsulant 87 includes an opening 871 defined by the first pillar 841. The roughness of a side surface of the opening 871 is defined by the lateral surface 8413 of the first conductive pillar 841. As shown in FIG. 43, the first conductive pillar 841 is free from possessing a lateral extension portion between the top surface 8411 and the bottom surface 8412.

In some embodiments, after the steps in FIG. 43, a singulation process may be performed to form the semiconductor package structure 3A shown in FIG. 36.

Figure 44:
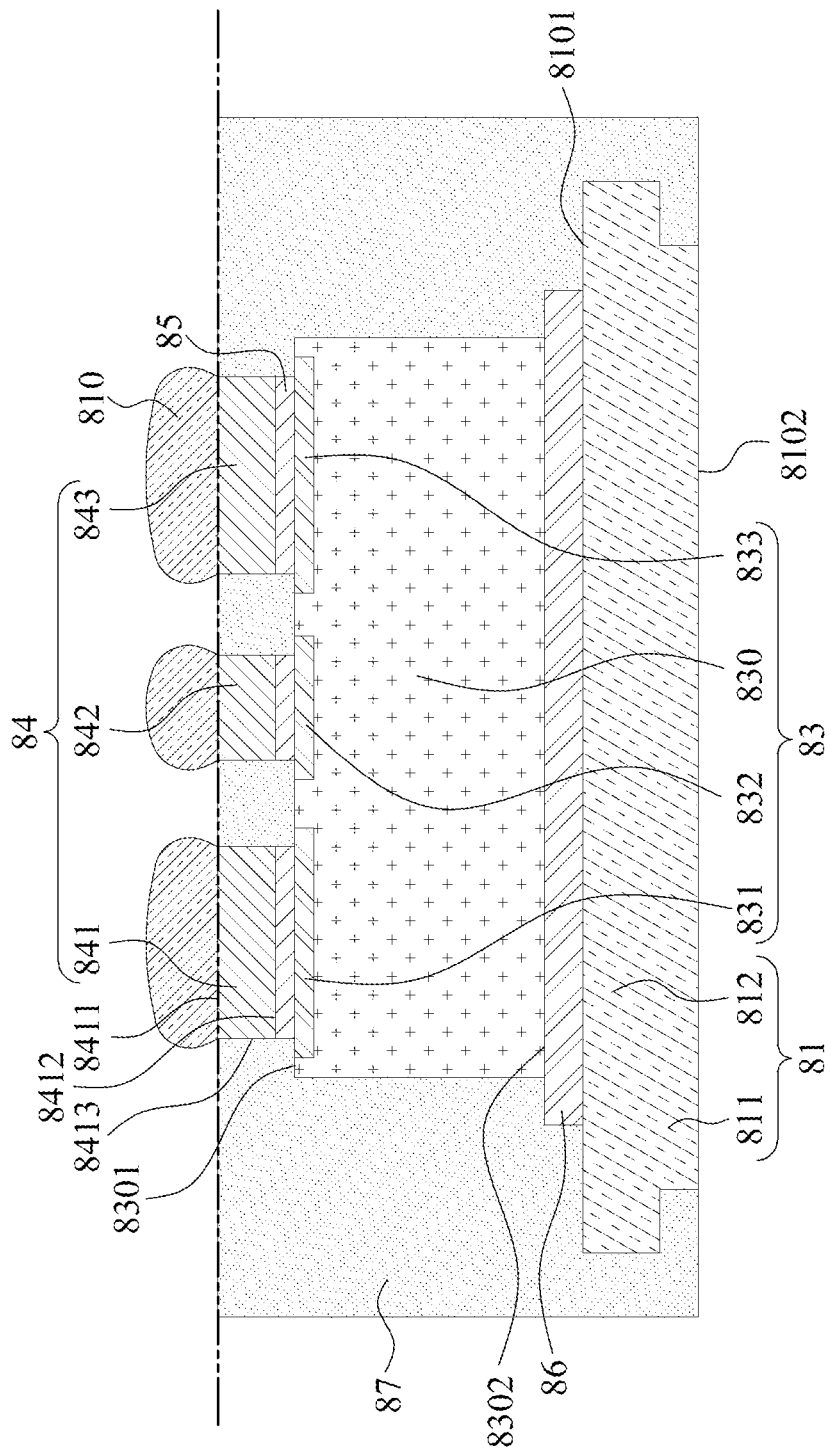
FIG. 44 illustrates one or more stages of an example of a method for manufacturing a semiconductor package structure according to some embodiments of the present disclosure.

FIG. 44 illustrates one or more stages of an example of a method for manufacturing a semiconductor package structure according to some embodiments of the present disclosure. In some embodiments, the method is for manufacturing the semiconductor package structure 3B shown in FIG. 37. The initial stages of the illustrated process are the same as, or similar to, the stages illustrated in FIG. 40 to FIG. 43. FIG. 44 depicts a stage subsequent to that depicted in FIG. 43.

Referring to FIG. 44, a plurality of connection elements 810 is formed on the first plurality of conductive pillars 84. Afterwards, a substrate may be attached to the plurality of connection elements 810 and a singulation process may be performed to form the semiconductor package structure 3B shown in FIG. 37.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:
   a conductive base having a first surface;
   a first semiconductor die disposed on the first surface of the conductive base;
   a first conductive pillar disposed on the first semiconductor die;
   a first encapsulant disposed on the first surface of the conductive base and encapsulating the first semiconductor die,
   wherein the first encapsulant further includes an opening defined by the first conductive pillar; and
   a second encapsulant disposed on a second surface of the conductive base opposite to the first surface of the conductive base,
   wherein the conductive base includes a curved surface, and
   wherein a portion of the second encapsulant is in contact with the curved surface.

2. The semiconductor package structure of claim 1, further comprising a conductive post in contact with the first surface of the conductive base.

3. The semiconductor package structure of claim 2, wherein the conductive post includes a top portion and a bottom portion, and wherein a width of the bottom portion is greater than a width of the top portion.

4. The semiconductor package structure of claim 2, wherein the conductive post has a first surface away from the first surface of the conductive base, and wherein the first surface of the first encapsulant and the first surface of the conductive post are substantially coplanar or the first surface of the first encapsulant is lower than the first surface of the conductive post.

5. The semiconductor package structure of claim 2, wherein the first semiconductor die has a first surface away from the first surface of the conductive base and a second surface toward the first surface of the conductive base, and wherein the first semiconductor die includes a first electrode disposed adjacent to the second surface and electrically connected to the conductive post through the conductive base.

6. The semiconductor package structure of claim 1, wherein the first conductive pillar is surrounded by and in contact with the first encapsulant.

7. The semiconductor package structure of claim 1, wherein the first encapsulant has a first surface away from the first surface of the conductive base, and the first conductive pillar has a first surface away from the first surface of the conductive base, and wherein the first surface of the first encapsulant and the first surface of the first conductive pillar are substantially coplanar.

8. The semiconductor package structure of claim 1, further comprising an interface between the first encapsulant and the second encapsulant, wherein the interface is at the same elevation with the first surface of the conductive base.

9. The semiconductor package structure of claim 1, wherein the first encapsulant is composed of epoxy and a plurality of fillers.

10. The semiconductor package structure of claim 1, further comprising:
    a second semiconductor die adjacent to the conductive post; and
    a second conductive pillar disposed on the second semiconductor die,
    wherein the first semiconductor die and the second semiconductor die are configured to electrically connect to each other through a substrate.

11. A semiconductor package structure, comprising:
    a conductive base;
    a first semiconductor die disposed on a first surface of the conductive base;
    a first conductive pillar disposed on a first surface of the first semiconductor die;
    a first encapsulant disposed on the conductive base,
    wherein the first conductive pillar and the first encapsulant each has a top surface away from the conductive base, and
    wherein the top surface of the first conductive pillar is higher than or at the same elevation with the top surface of the first encapsulant; and
    a second encapsulant disposed on a second surface of the conductive base opposite to the first surface of the conductive base, wherein the conductive base includes a curved surface, and wherein a portion of the second encapsulant is in contact with the curved surface.

12. The semiconductor package device of claim 11, wherein the first conductive pillar has a bottom surface toward the first semiconductor die, and the first conductive pillar is free from possessing a lateral extension portion between the top surface and the bottom surface.

13. The semiconductor package device of claim 11, wherein the first conductive pillar has a lateral surface, and wherein the lateral surface is in contact with the first encapsulant.

14. The semiconductor package device of claim 11, further comprising a conductive post in contact with the conductive base and having a bottom surface, and wherein a width of the bottom surface is wider than that of the top surface of the conductive post.

15. A method of manufacturing a semiconductor package structure, comprising:

providing a conductive base having a conductive post, wherein the conductive post has a first surface;

attaching a first semiconductor die to a first surface of the conductive base, wherein the first semiconductor die comprises a first conductive pillar;

forming a first encapsulant on the first surface of the conductive base to encapsulate the first semiconductor die; and forming a second encapsulant on a second surface of the conductive base opposite to the first surface of the conductive base, wherein the conductive base includes a curved surface, and wherein a portion of the second encapsulant is in contact with the curved surface.

16. The method of claim 15, further comprising:

attaching a second semiconductor die to the first surface of the conductive base;

etching the conductive base from the second surface of the conductive base to form a plurality of discrete units with a portion of the curved surface.

17. The method of claim 15, further comprising grinding the first encapsulant such that a first surface of the first conductive pillar and a first surface of the first encapsulant are exposed.

18. The method of claim 15, wherein forming the first encapsulant comprises performing a film molding operation.

* * * * *